(12) United States Patent
Burns et al.

(10) Patent No.: US 9,972,533 B2
(45) Date of Patent: May 15, 2018

(54) ALIGNING CONDUCTIVE VIAS WITH TRENCHES

(71) Applicant: INTERNATIONAL BUSINESS MACHINES CORPORATION, Armonk, NY (US)

(72) Inventors: Sean D. Burns, Hopewell Junction, NY (US); Lawrence A. Clevenger, LaGrangeville, NY (US); Matthew E. Colburn, Schenectady, NY (US); Sivananda K. Kanakasabapathy, Niskayuna, NY (US); Yann A. M. Mignot, Slingerlands, NY (US); Christopher J. Penny, Saratoga Springs, NY (US); Roger A. Quon, Rhinebeck, NY (US); Nicole Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/677,539

(22) Filed: Aug. 15, 2017

(65) Prior Publication Data

US 2018/0025943 A1 Jan. 25, 2018

Related U.S. Application Data

(62) Division of application No. 15/176,286, filed on Jun. 8, 2016, now Pat. No. 9,773,700.

(51) Int. Cl.
*H01L 21/768* (2006.01)
*H01L 23/522* (2006.01)

(52) U.S. Cl.
CPC .. *H01L 21/76897* (2013.01); *H01L 21/76802* (2013.01); *H01L 21/76843* (2013.01);
(Continued)

(58) Field of Classification Search
CPC ......... H01L 21/76843; H01L 21/76877; H01L 21/76829; H01L 21/76802;
(Continued)

(56) References Cited

U.S. PATENT DOCUMENTS

| 2014/0024219 A1* | 1/2014 | Jung | H01L 21/0337 438/703 |
|---|---|---|---|
| 2014/0187047 A1* | 7/2014 | Tagami | H01L 21/0276 438/703 |

OTHER PUBLICATIONS

List of IBM Patents or Patent Applications Treated as Related; (Appendix P), Filed Aug. 15, 2017, 2 pages.
(Continued)

*Primary Examiner* — Ratisha Mehta
(74) *Attorney, Agent, or Firm* — Cantor Colburn LLP; Vazken Alexanian

(57) ABSTRACT

A method for forming conductive contacts on a wafer comprises forming a first hardmask, planarizing layer, second hardmask, and a layer of sacrificial mandrel material, and removing portions of the layer of sacrificial mandrel material to expose portions of the second hardmask and form a first and second sacrificial mandrel. Spacers are formed adjacent to the sacrificial mandrels. A filler material is deposited on the second hardmask, and a first mask is formed on the filler material. An exposed portion of the second sacrificial mandrel is removed to form a first cavity. The depth of the first cavity is increased. The first mask, portions of the first and second sacrificial mandrels, the filler material, portions of the second hardmask, the spacers, portions of the planarization layer and the first hardmask are removed. A second cavity is formed and the first and second cavities are filled with a conductive material.

20 Claims, 45 Drawing Sheets

(52) U.S. Cl.
CPC .. *H01L 21/76816* (2013.01); *H01L 21/76831* (2013.01); *H01L 21/76877* (2013.01); *H01L 23/5226* (2013.01)

(58) Field of Classification Search
CPC ......... H01L 21/76816; H01L 21/76897; H01L 21/76831; H01L 23/5226; H01L 21/768; H01L 23/522; H01L 23/528
See application file for complete search history.

(56) References Cited

OTHER PUBLICATIONS

Sean D. Burns, et al., "Self Aligned Conductive Lines", U.S. Appl. No. 15/176,279, filed Jun. 8, 2016.
Sean D. Burns, et al., "Self Aligned Conductive Lines", U.S. Appl. No. 15/176,284, filed Jun. 8, 2016.
Sean D. Burns, et al., "Aligning Conductive Vias With Trenches", U.S. Appl. No. 15/176,286, filed Jun. 8, 2016.
Sean D. Burns, et al., "Self Aligned Conductive Lines", U.S. Appl. No. 15/667,447, filed Aug. 15, 2017.

* cited by examiner

ALIGNING CONDUCTIVE VIAS WITH TRENCHES

DOMESTIC PRIORITY

This application is a Divisional of Non-Provisional application Ser. No. 15/176,286, entitled "ALIGNING CONDUCTIVE VIAS WITH TRENCHES", filed Jun. 8, 2016, the contents of which are incorporated by reference.

BACKGROUND

The present invention generally relates to complimentary metal-oxide semiconductors (CMOS) and metal-oxide-semiconductor field-effect transistors (MOSFET), and more specifically, conductive vias and conductive lines used in semiconductor devices.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are largely determined by the wavelength of the irradiation.

SUMMARY

According to an embodiment of the present invention, a method for forming conductive contacts on a semiconductor wafer comprises forming a first hardmask on an insulator layer, a planarizing layer on the first hardmask, a second hardmask on the planarizing layer and a layer of sacrificial mandrel material on the second hardmask. Portions of the layer of sacrificial mandrel material are removed to expose portions of the second hardmask and form a first sacrificial mandrel and a second sacrificial mandrel on the second hardmask. Spacers are formed adjacent to sidewalls of the first sacrificial mandrel and sidewalls of the second sacrificial mandrel. A filler material is deposited on the second hardmask between the first sacrificial mandrel and the second sacrificial mandrel. A first mask is formed on the filler material, the first sacrificial mandrel and a portion of the second sacrificial mandrel. An exposed portion of the second sacrificial mandrel is removed to form a first cavity that exposes a portion of the second hardmask. An exposed portion of the second hardmask, an exposed portion of the planarizing layer, and an exposed portion of the first hardmask are removed to increase a depth of the first cavity and expose a portion of the insulator layer. The first mask and exposed portions of the first sacrificial mandrel, the second sacrificial mandrel and the filler material are removed. Exposed portions of the second hardmask and the spacers are removed. Exposed portions of the planarization layer and the first hardmask are removed. Exposed portions of the insulator layer are removed to further increase the depth of the first cavity to expose a conductive line and form a second cavity in the insulator layer. The first cavity and the second cavity are filled with a conductive material.

According to another embodiment of the present invention, a method for forming conductive contacts on a semiconductor wafer comprises forming a hardmask on an insulator layer, a planarizing layer on the hardmask and a layer of sacrificial mandrel material on the planarizing layer, and removing portions of the layer of sacrificial mandrel material to expose portions of the planarizing layer and form a first sacrificial mandrel and a second sacrificial mandrel on the planarizing layer. A layer of spacer material is deposited over the planarizing layer, the first sacrificial mandrel and the second sacrificial mandrel, and a first filler material is deposited over the layer of spacer material. A first mask is patterned over the filler material. Portions of the first filler material are removed to expose a portion of the layer of spacer material over a portion of the first sacrificial mandrel and removing the mask. A portion of the layer of spacer material is removed and an exposed portion of the first sacrificial mandrel to form a first cavity that exposes a portion of the planarizing layer. The first cavity is filled with a second filler material. A second mask is patterned over the first filler material. Portions of the first filler material are removed to form a second cavity that exposes portions of the layer of spacer material between the first cavity and the second sacrificial mandrel. The second cavity is filled with the second filler material. A third mask is patterned over a portion of the second sacrificial mandrel. Exposed portions of the second filler material a portion of the layer of spacer material, the planarizing layer and the hardmask are selectively removed to form a second cavity. A fourth mask is patterned over a portion of the second sacrificial mandrel. An exposed portion of the second sacrificial mandrel, a portion of the planarizing layer and a portion of the hardmask are removed to form a third cavity. Exposed portions of the insulator layer are removed to increase a depth of the second cavity and a depth of the third cavity. The second cavity and the third cavity are filled with a conductive material.

BRIEF DESCRIPTION OF THE DRAWINGS

FIGS. 1-20 illustrate an exemplary embodiment of a method for forming conductive vias and conductive lines for a semiconductor device.

FIG. 1 illustrates a side view of a structure formed on a substrate.

FIG. 2 illustrates a side view following an etching process that selectively removes exposed portions of the sacrificial mandrel layer.

FIG. 3 illustrates a top view of the patterned resist arranged on the second hardmask.

FIG. 4 illustrates a side view following the deposition of a layer of spacer material over exposed portions of the second hardmask and the sacrificial mandrels.

FIG. 5 illustrates a side view following the formation of spacers along sidewalls of the sacrificial mandrels.

FIG. 8 illustrates a cut-away view following a selective etching process that removes exposed portions of the sacrificial mandrel (of FIG. 7A) and forms a cavity.

FIG. 10 illustrates a cut-away view following a selective etching process that removes exposed portions of the non-mandrel line (of FIG. 9A) and forms a cavity.

FIG. 12 illustrates a cut-away view following a selective etching process that removes exposed portions of the sacrificial mandrels (of FIG. 11A).

FIG. 15 illustrates a cut-away view following a selective etching process that removes exposed portions of the second hardmask.

FIG. 16 illustrates a cut-away view following an etching process that removes the remaining features above the second hardmask.

FIG. 17 illustrates a cut-away view of the resultant structure following a selective etching process.

FIG. 18 illustrates a cut-away view following the removal of the materials over the first hardmask and a selective etching process.

FIG. 19 illustrates a cut-away view along the line A-A (of FIG. 20) following the deposition and polishing of a conductive material.

FIG. 20 illustrates a top view of the resultant structure following the formation of the conductive lines and vias.

FIGS. 21-46 illustrate an exemplary embodiment of a method for forming conductive vias and conductive lines for a semiconductor device.

FIG. 21 illustrates a side view of a structure formed on a substrate 103 that is similar to the structure described in FIG. 1.

FIG. 22 illustrates a side view following the removal of portions of the sacrificial mandrel layer to form sacrificial mandrels.

FIG. 23 illustrates a side view following the deposition of a layer of spacer material 402 over portions of the sacrificial mandrels and the second hardmask.

FIG. 24 illustrates a side view following the deposition of a filler layer over the layer of spacer material.

FIG. 26 illustrates a cut-away view following a selective etching process that removes exposed portions of the third hardmask and portions of the filler layer.

FIG. 28 illustrates a cut-away view following the removal of the exposed sacrificial mandrel.

FIG. 29 illustrates the resultant structure following the deposition of another filler layer that fills the cavity.

FIG. 31 illustrates a cut-away view following a selective etching process that removes exposed portions of the filler layers and the hardmask.

FIG. 32 illustrates a cut-away view following the deposition of a filler layer in the cavity (of FIG. 31).

FIG. 33 illustrates a cut-away view following a selective etching process that removes exposed portions of the filler layers.

FIG. 34 illustrates a cut-away view following a selective etching process that removes the third hardmask and portions of the fill material.

FIG. 35 illustrates a cut-away view following an etching process that removes exposed portions of the layer of spacer material to expose the sacrificial mandrels.

FIG. 37 illustrates a cut-away view following a selective etching process.

FIG. 39 illustrates a cut-away view following a selective etching process that removes exposed portions of the mandrel to form a cavity.

FIG. 40 illustrates a cut-away view following the removal of the mask using a suitable process.

FIG. 41 illustrates a cut-away view following a selective etching process.

FIG. 42 illustrates a cut-away view of the resultant structure following an etching process that removes the spacers, the filler layers, and the second hardmask.

FIG. 43 illustrates a cut-away view of the resultant structure following the removal of the remaining organic planarization layer.

FIG. 44 illustrates a cut-away view of the resultant structure following a selective anisotropic etching process.

FIG. 45 illustrates a cut-away view along the line A-A (of FIG. 46) following the deposition and polishing of a conductive material.

FIG. 46 illustrates a top view of the resultant structure following the formation of the conductive lines and vias.

DETAILED DESCRIPTION

Conductive connections in semiconductor devices and integrated circuits often include conductive lines that are arranged in trenches formed in an insulating material. The conductive lines connect to devices in the circuit. Integrated circuits often have multiple layers of devices and conductive lines arranged on one or more wafers. Conductive vias are used to form electrical connections between different layers of an integrated circuit.

As the scale of semiconductor devices continues to decrease, aligning and patterning vias in desired locations on the chip continues to become more challenging. Typically, in an integrated circuit having trenches filled with conductive material to form conductive lines, it is desirable to pattern and define vias that are aligned with the trenches. As the pitch of the trenches or lines scales down, the use of previous patterning methods has not resulted in a desired via and trench alignment.

Methods for forming self-aligned or fully aligned vias include patterning a via that is larger than the trench. The via is etched such that the etched via is formed in areas where the trench exists.

The embodiments described herein provide for a method for patterning that distinguishes mandrel lines and non-mandrel lines on device during the formation of the vias. The method allows vias to be selectively formed on either mandrel or non-mandrel lines.

FIGS. 1-20 illustrate an exemplary embodiment of a method for forming conductive vias and conductive lines for a semiconductor device.

Figure 1:
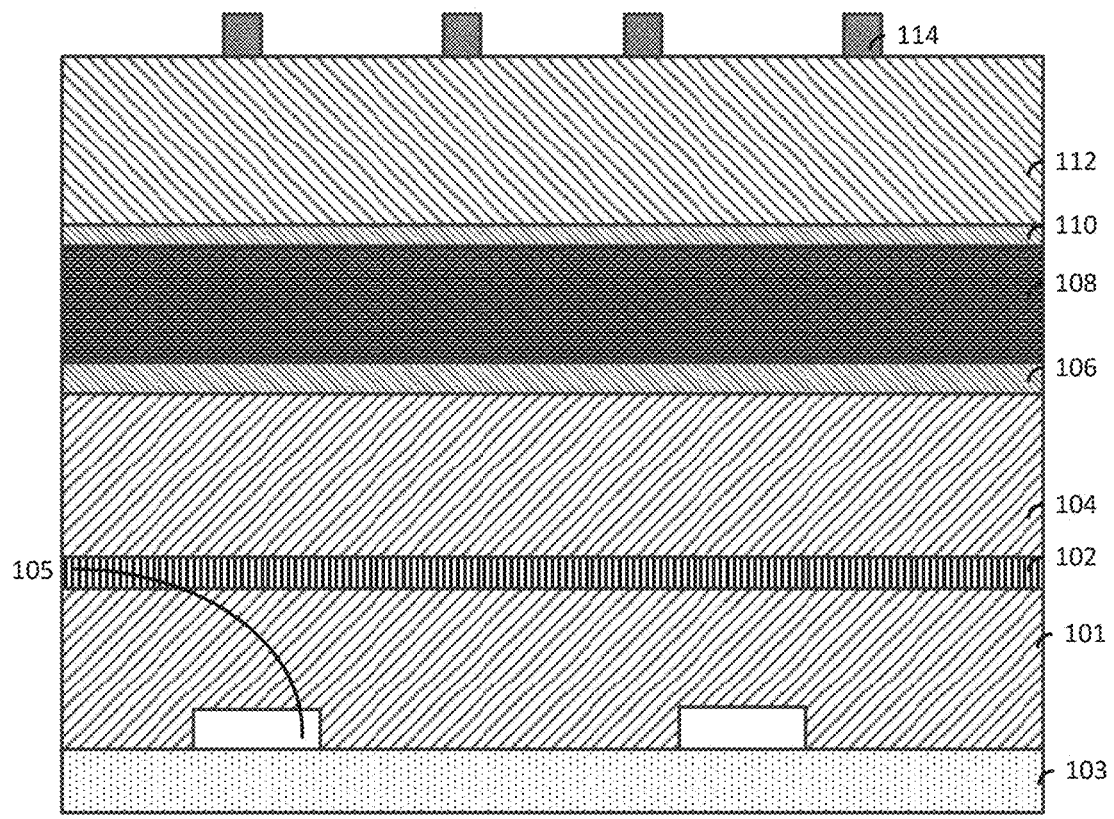

FIG. 1 illustrates a side view of a structure formed on a substrate 103. The substrate may include, for example, any suitable semiconductor material.

Non-limiting examples of suitable materials for the semiconductor layer 103 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

Semiconductor devices 105 are arranged on the substrate 103. The semiconductor devices 105 may include, for example, MOSFET or other types of electronic devices. A layer of insulating material 101 such as, for example, an oxide material is arranged over the substrate 103 and the semiconductor devices 105. A conductive line 102 is arranged on the layer of insulating material 101. The conductive line 102 may include a conductive metallic material such as, for example, copper, aluminum, silver, gold, or another suitable conductive material.

One or more of the semiconductor devices 105 may be electrically connected to the conductive line 102. In the illustrated exemplary embodiments described herein a method for forming conductive lines and vias that connect to the underlying conductive line 102 will be described.

FIG. 1 further includes an inter-level dielectric layer (insulator layer) 104 arranged on the conductive line 102. In the illustrated exemplary embodiment, the insulator layer 104 is an inter-level dielectric layer.

The inter-level dielectric layer 104 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 104 is deposited by a deposition process, including, but not limited to CVD, PVD, plasma enhanced CVD, atomic layer deposition (ALD), evaporation, chemical solution deposition, or like processes. Following the deposition of the inter-level dielectric layer 104, a planarization process such as, for example, chemical mechanical polishing is performed.

A first hardmask 106 is arranged on the inter-level dielectric layer 104. The first hardmask 106 may include, for example, titanium nitride, silicon oxide, silicon nitride (SiN), SiOCN, SiBCN or any suitable combination of those. The first hardmask 106 may be deposited using a deposition process, including, but not limited to, PVD, CVD, PECVD, or any combination thereof.

An organic planarization layer (OPL) 108 is arranged on the first hardmask 106. This OPL 108 may be deposited by, for example, a spin-on process followed by a bake.

A second hardmask 110 is arranged on the organic planarization layer 108. The second hardmask 110 in the illustrated embodiment is similar to the first hardmask 106 however, in alternate exemplary embodiments, the first hardmask 106 and the second hardmask 110 may include dissimilar materials respectively.

A sacrificial mandrel layer 112 is arranged on the second hardmask 110. The sacrificial mandrel layer 112 in the illustrated exemplary embodiment includes an amorphous silicon material, alternate exemplary embodiments may include other materials such as, for example, an amorphous carbon material or a nitride material such as silicon nitride or titanium nitride.

A resist 114 is patterned on the sacrificial mandrel layer 112. Suitable resist masks include photoresists, electron-beam resists, ion-beam resists, X-ray resists and etch resists. The resist may a polymeric spin on material or a polymeric material.

Figure 2:
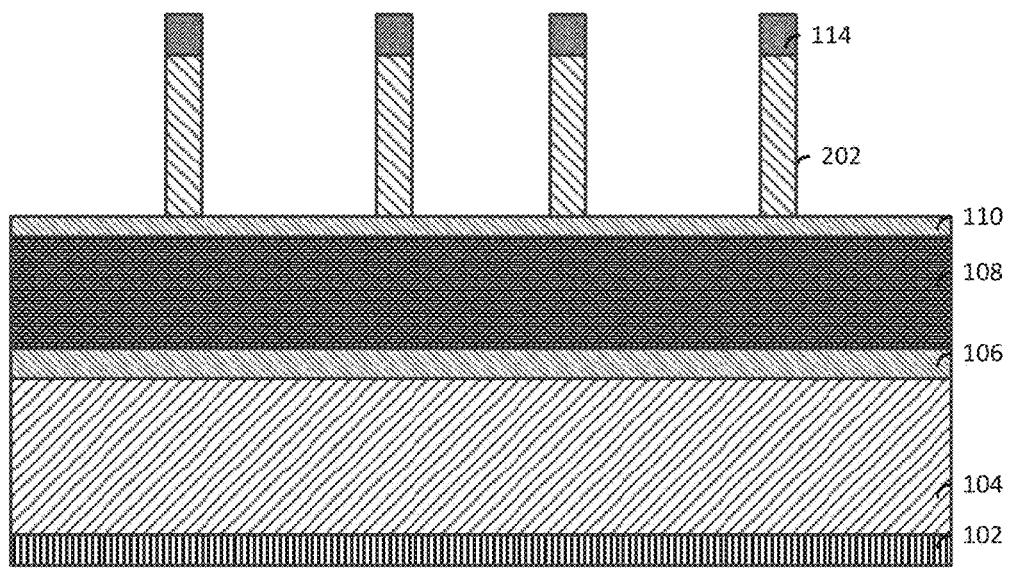

FIG. 2 illustrates a side view following an etching process such as, for example, reactive ion etching that selectively removes exposed portions of the sacrificial mandrel layer 112 to expose portions of the second hardmask 110 and form sacrificial mandrels (mandrel lines) 202. For simplicity and illustrative purposes, the substrate 103, the semiconductor devices 105, and the insulator layer 101 have been omitted from FIG. 2 and subsequent figures.

Figure 3:
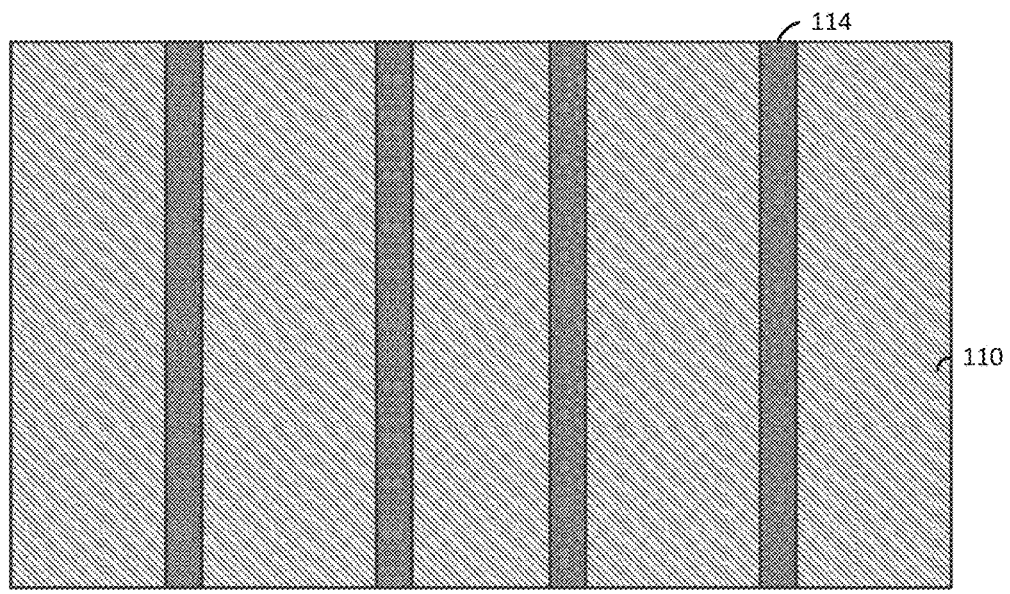

FIG. 3 illustrates a top view of the patterned resist 114 arranged on the second hardmask 110.

Figure 4:
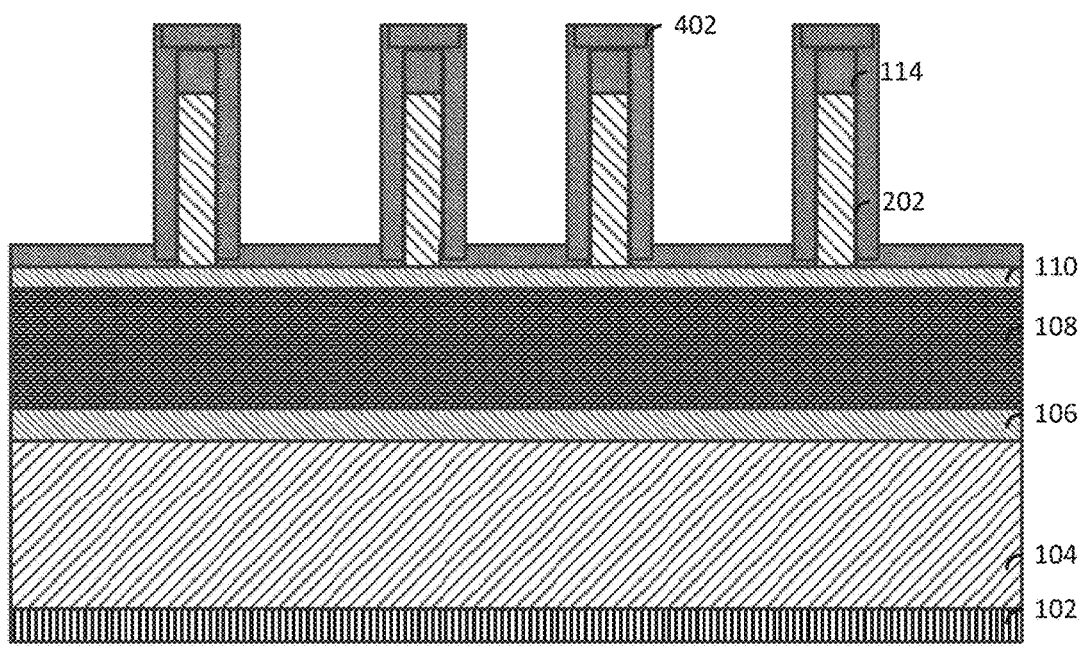

FIG. 4 illustrates a side view following the deposition of a layer of spacer material 402 over exposed portions of the second hardmask 110 and the sacrificial mandrels 202.

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 5:
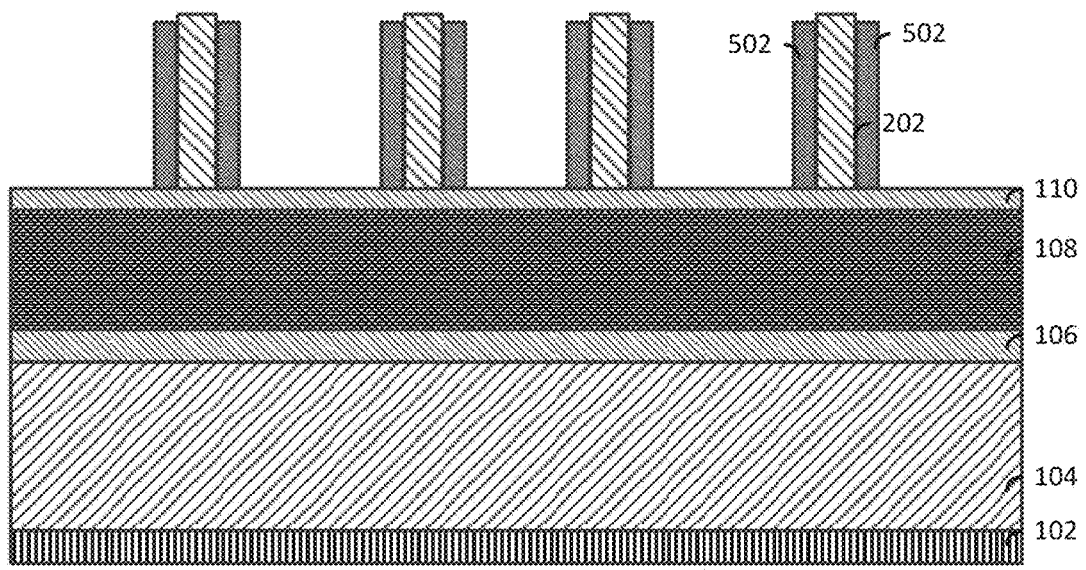

FIG. 5 illustrates a side view following the formation of spacers 502 along sidewalls of the sacrificial mandrels 202. Following the deposition of the layer of spacer material, a suitable anisotropic etching process such as, for example, a reactive ion etching process is performed to remove portions of the layer of spacer material and form the spacers 502.

Figure 6A:
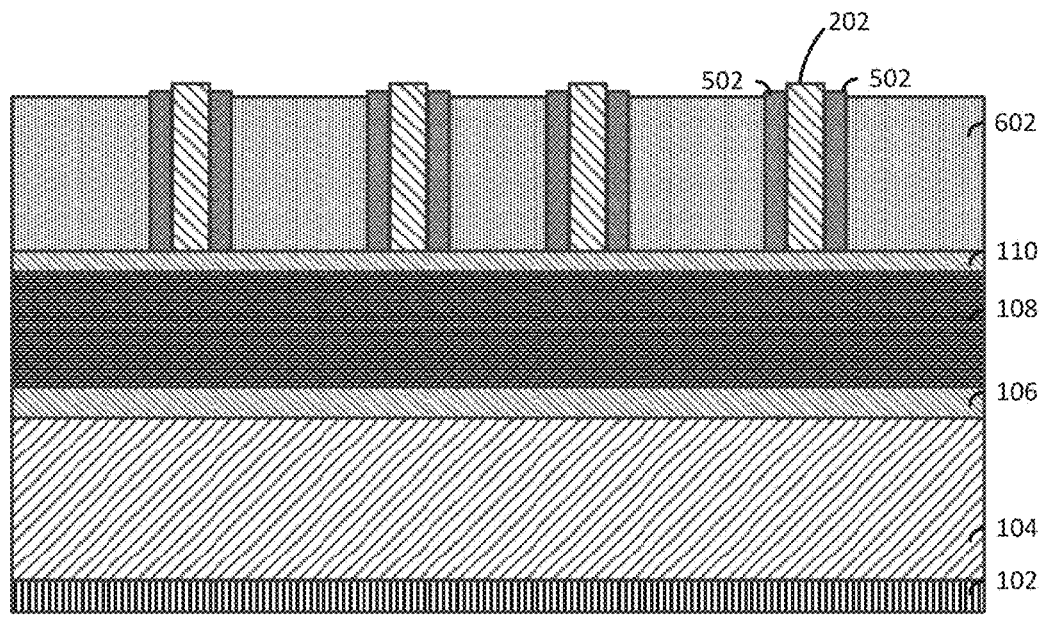
FIG. 6A illustrates a side view following the formation of a non-mandrel lines over exposed portions of the second hardmask.
Figure 6B:
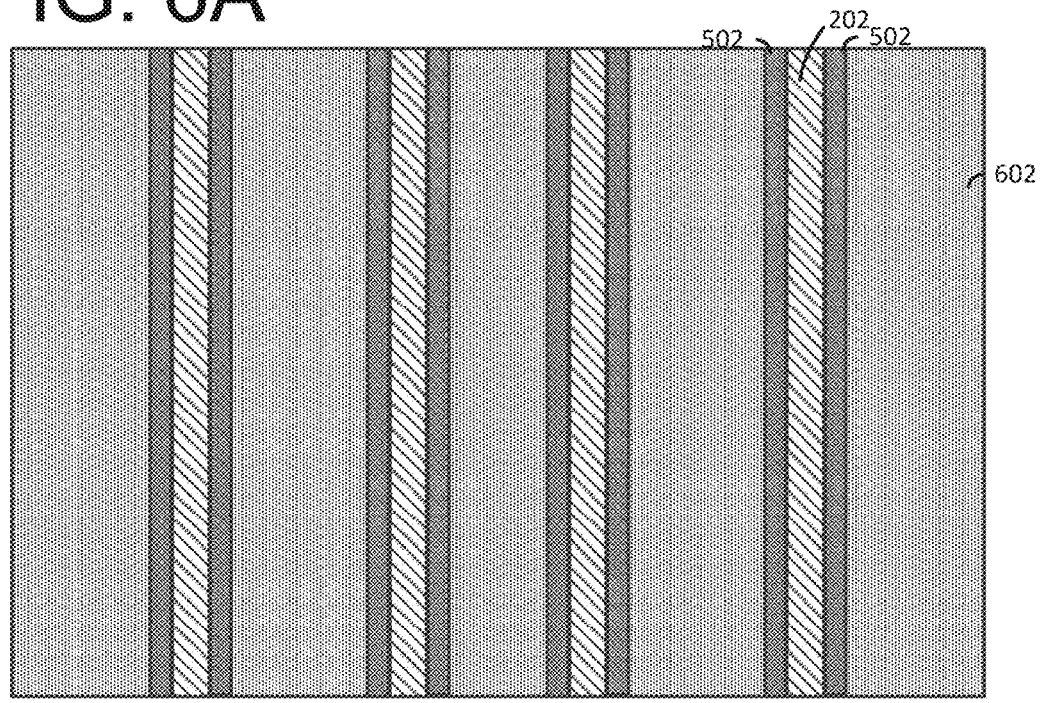
FIG. 6B illustrates a top view of the sacrificial mandrels, the spacers, and the non-mandrel lines.

FIG. 6A illustrates a side view following the formation of a non-mandrel lines 602 over exposed portions of the second hardmask 110. The non-mandrel lines 602 are formed by, for example, depositing a flowable material such as a carbide material over the second hardmask 110 adjacent to the spacers 502. Following the deposition of the non-mandrel line material, an etching or planarization process may be performed to define the non-mandrel lines 602. FIG. 6B illustrates a top view of the sacrificial mandrels 202, the spacers 502, and the non-mandrel lines 602.

Various materials have been discussed above regarding the sacrificial mandrels 202, the spacers 502, and the non-mandrel lines 602 features. In the illustrated exemplary embodiment, the materials used for the sacrificial mandrels 202, the spacers 502 and the non-mandrel lines 602 are dissimilar materials that provide for selective etching such that each of the features may be selectively removed without substantially removing exposed portions of the remaining two features.

Figure 7A:
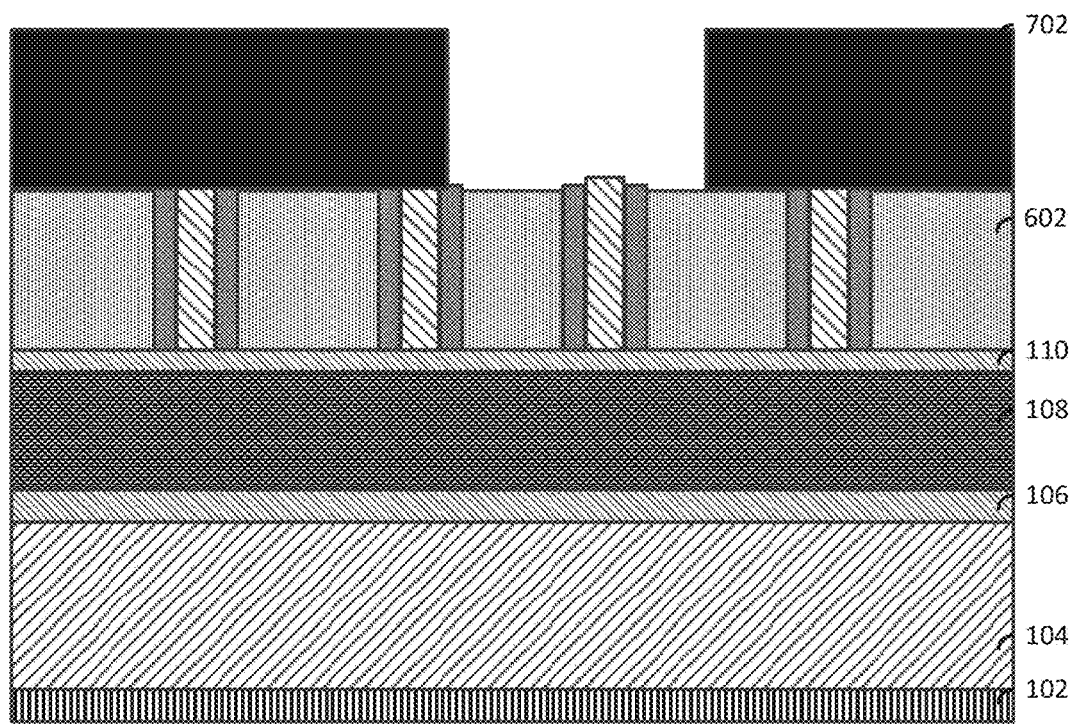
FIG. 7A illustrates a cut-away view along the line A-A (of FIG. 7B) following the formation of a photolithographic mask.
Figure 7B:
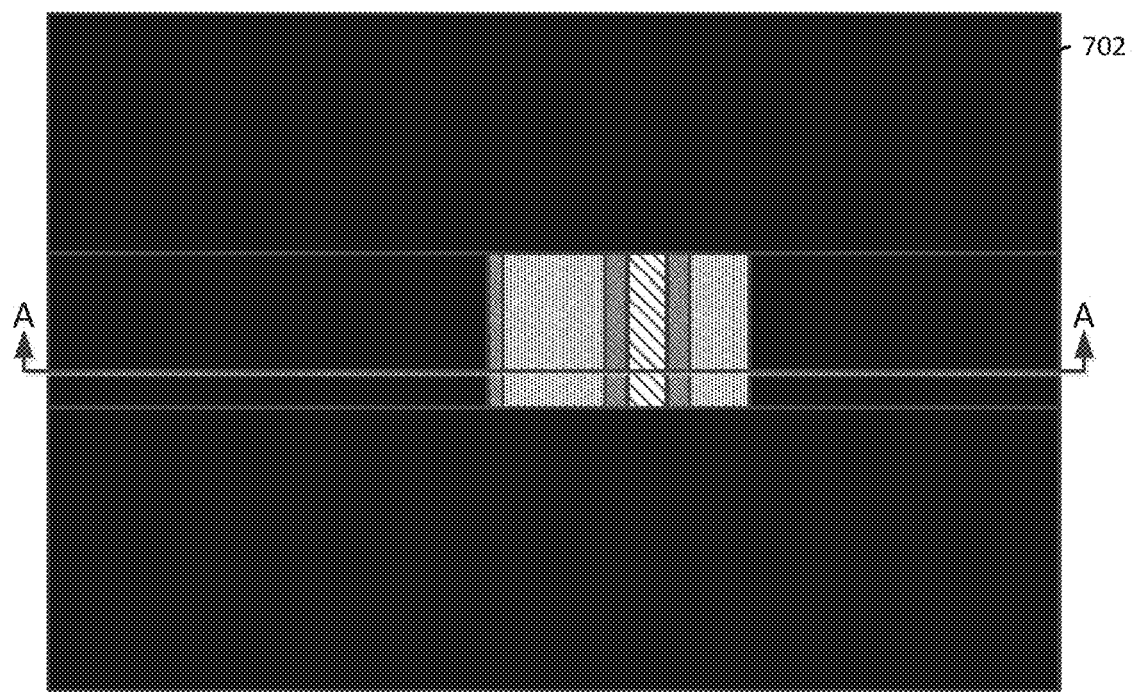
FIG. 7B illustrates a top view of the mask.

FIG. 7A illustrates a cut-away view along the line A-A (of FIG. 7B) following the formation of a photolithographic mask 702 over portions of the sacrificial mandrels 202, the spacers 502, and the non-mandrel lines 602. Suitable masks include photoresists, electron-beam resists, ion-beam resists, X-ray resists, and etch resists. The resist may a polymeric spin on material or a polymeric material. FIG. 7B illustrates a top view of the mask 702.

The mask 702 is arranged to expose a portion of a desired sacrificial mandrel 202. Because the sacrificial mandrel 202 is formed from a material that is dissimilar from the materials used to form the spacers 502 and the non-mandrel lines 602, the alignment of the mask 702 need only mask sacrificial mandrel 202 material that is not intended to be removed in the subsequent etching process (described below). Thus, the mask 702 may be aligned within a margin of error that is substantially equal to the width of the non-mandrel lines 602 and spacers 502 adjacent to the mandrel line 202 that will be subsequently etched.

Figure 8:
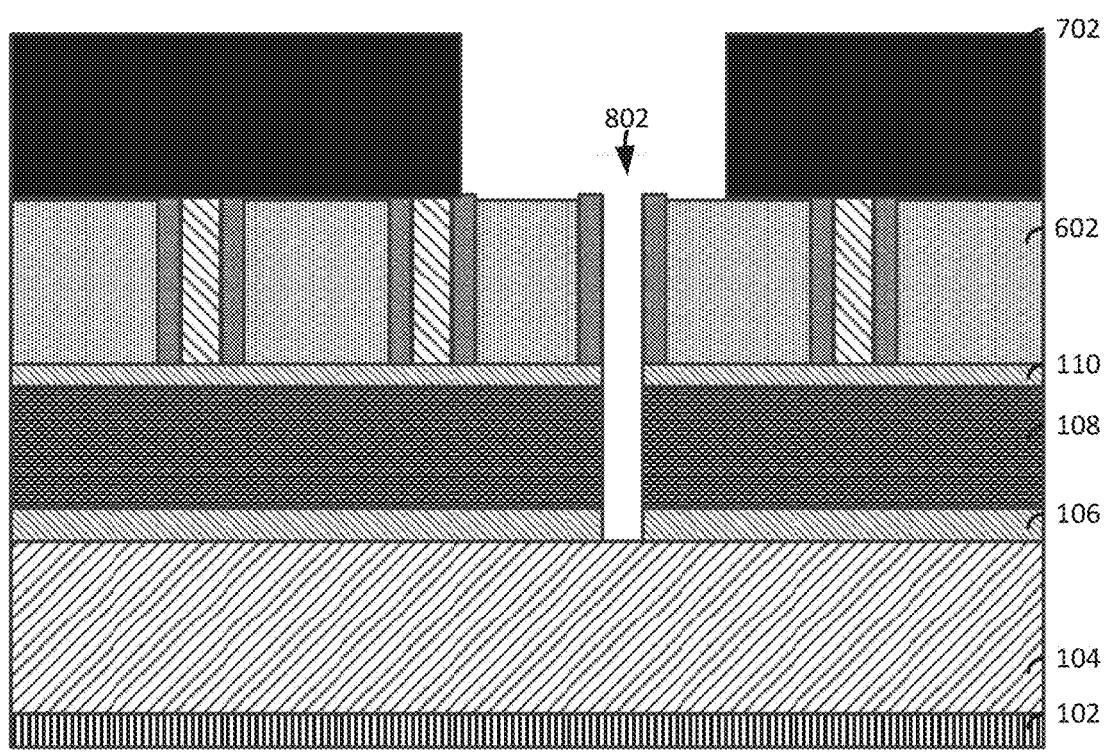

FIG. 8 illustrates a cut-away view following a selective etching process that removes exposed portions of the sacrificial mandrel 202 (of FIG. 7A) and forms a cavity 802. Following the removal of the exposed sacrificial mandrel 202, exposed portions of the underlying second hardmask 110, the organic planarization layer 106 and the first hardmask 106 are removed to expose a portion of the inter-level dielectric layer 104 using an anisotropic etching process.

Figure 9A:
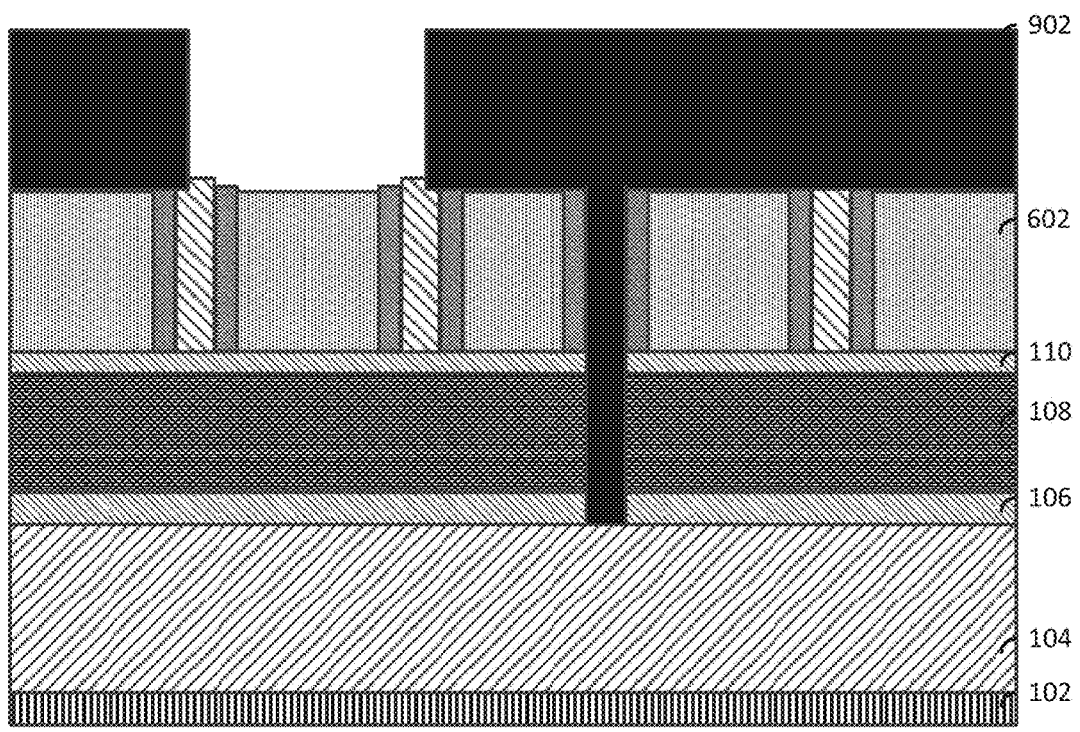
FIG. 9A illustrates a cut-away view along the line A-A (of FIG. 9B) following the patterning of a mask.
Figure 9B:
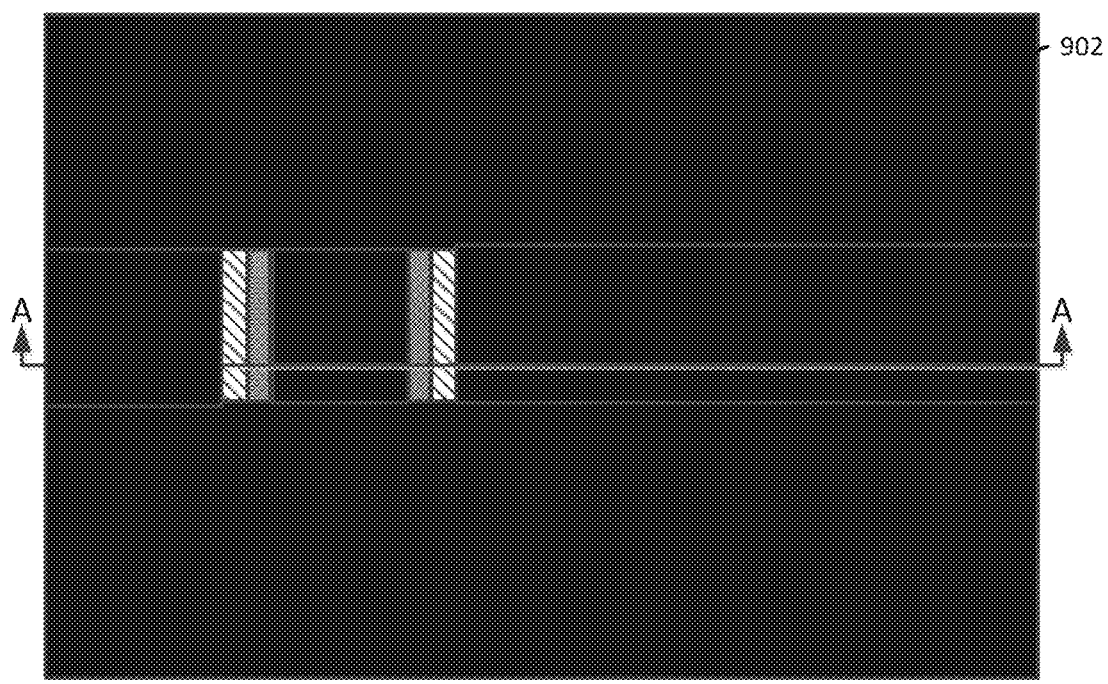
FIG. 9B illustrates a top view of the mask.

FIG. 9A illustrates a cut-away view along the line A-A (of FIG. 9B) following the patterning of a mask 902. The cavity 802 (of FIG. 8) is filled with the mask 902 material. FIG. 9B illustrates a top view of the mask 902.

The mask 902 is arranged to expose a portion of a non-mandrel line 602 that will be removed in a subsequent etching process (described below). Because the non-mandrel line 602 is formed from a material that is dissimilar from the materials used to form the spacers 502 and the sacrificial mandrel lines 202, the alignment of the mask 902 need only mask non-mandrel line 602 material that is not intended to be removed in the subsequent etching process. Thus, the margin for error in aligning the mask 902 is greater than previous methods.

Figure 10:
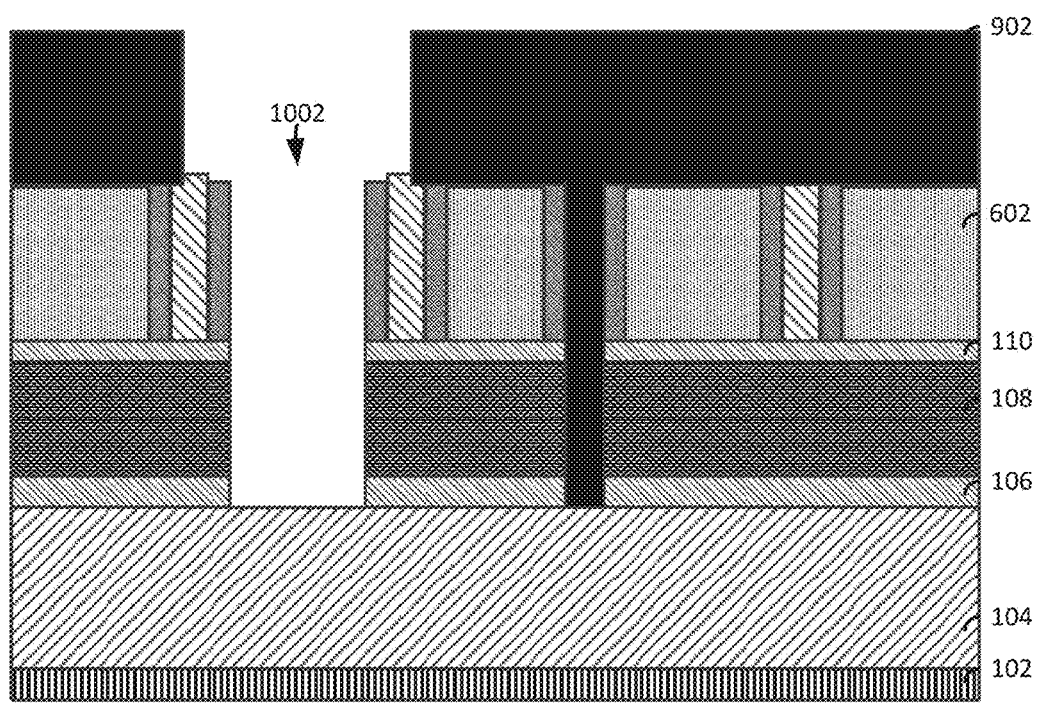

FIG. 10 illustrates a cut-away view following a selective etching process that removes exposed portions of the non-mandrel line 602 (of FIG. 9A) and forms a cavity 1002. Following the removal of the exposed sacrificial mandrel 202, exposed portions of the underlying second hardmask 110, the organic planarization layer 106 and the first hardmask 106 are removed to expose a portion of the inter-level dielectric layer 104 using an anisotropic etching process.

Figure 11A:
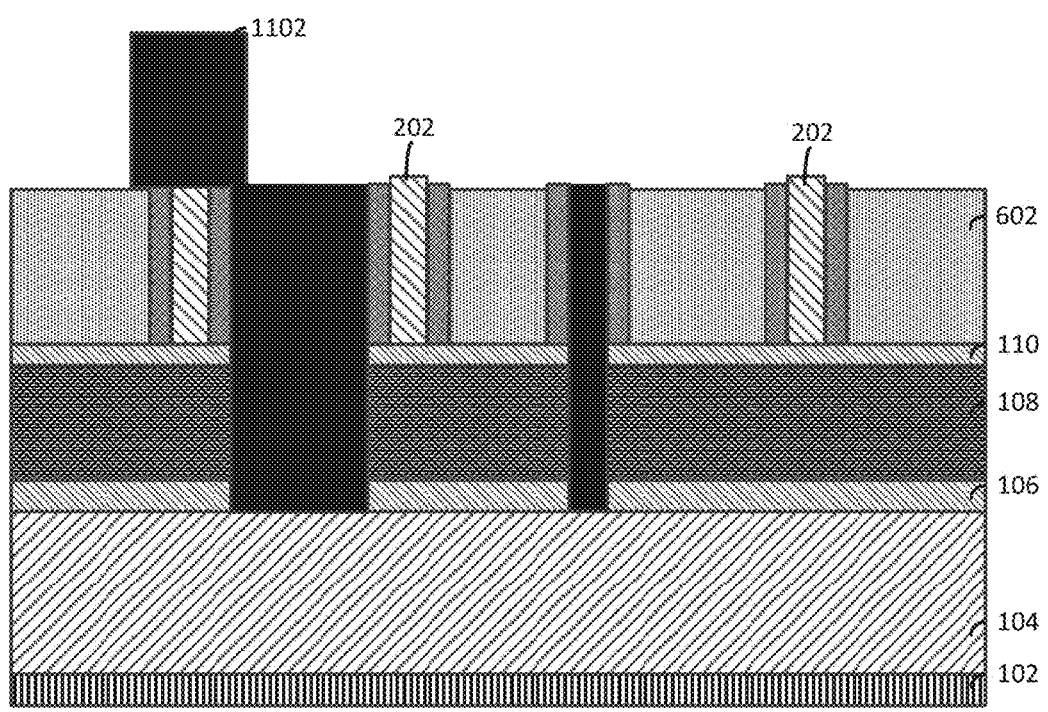
FIG. 11A illustrates a cut-away view along the line A-A (of FIG. 11B) following removal of the mask and the formation of a mask over a portion of a sacrificial mandrel.
Figure 11B:
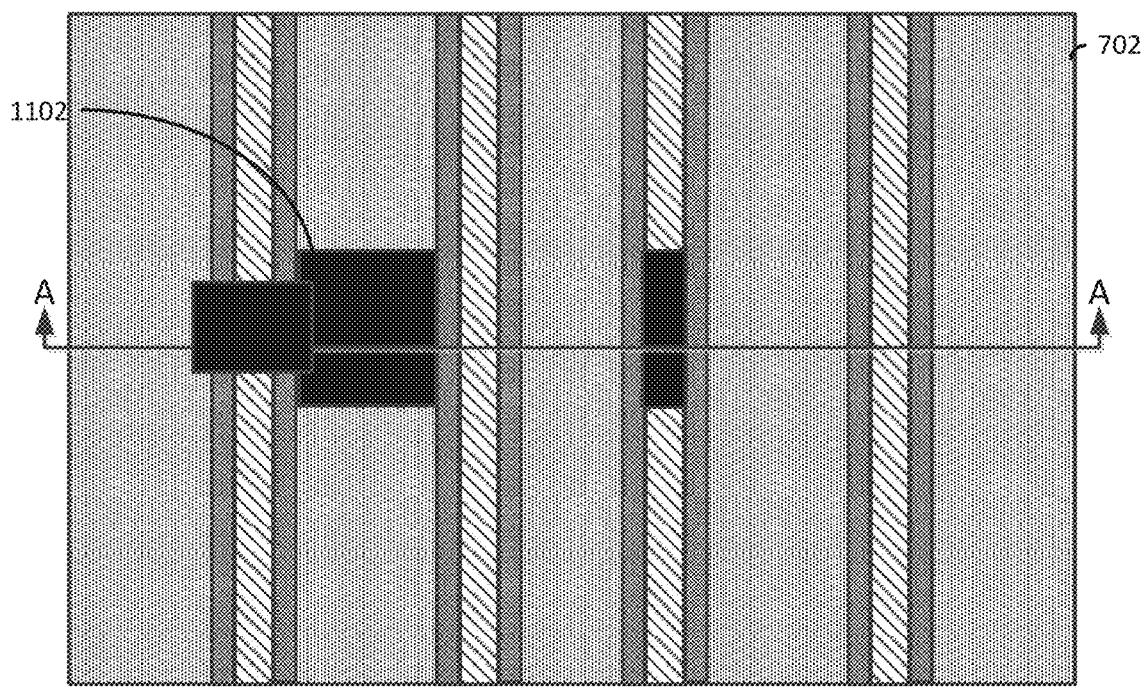
FIG. 11B illustrates a top view of the mask.

FIG. 11A illustrates a cut-away view along the line A-A (of FIG. 11B) following removal of the mask 902 and the formation of a mask 1102 over a portion of a sacrificial mandrel 202. The mask 110 fills the cavity 1002 (of FIG. 10). The mask 902 may be removed by, for example, an ashing process. The ashing process may be used to remove a photoresist material, amorphous carbon, or organic planarization (OPL) layer. Ashing is performed using a suitable reaction gas, for example, O2, N2, H2/N2, O3, CF4, or any combination thereof. FIG. 11B illustrates a top view of the mask 1102.

Figure 12:
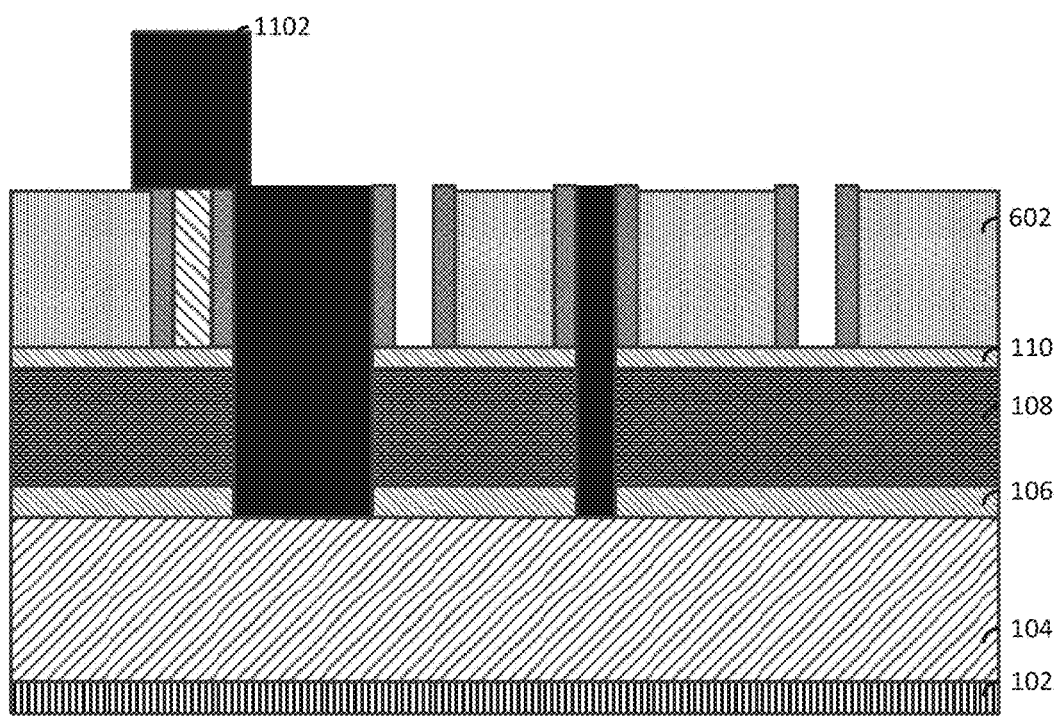

FIG. 12 illustrates a cut-away view following a selective etching process that removes exposed portions of the sacrificial mandrels 202 (of FIG. 11A).

Figure 13A:
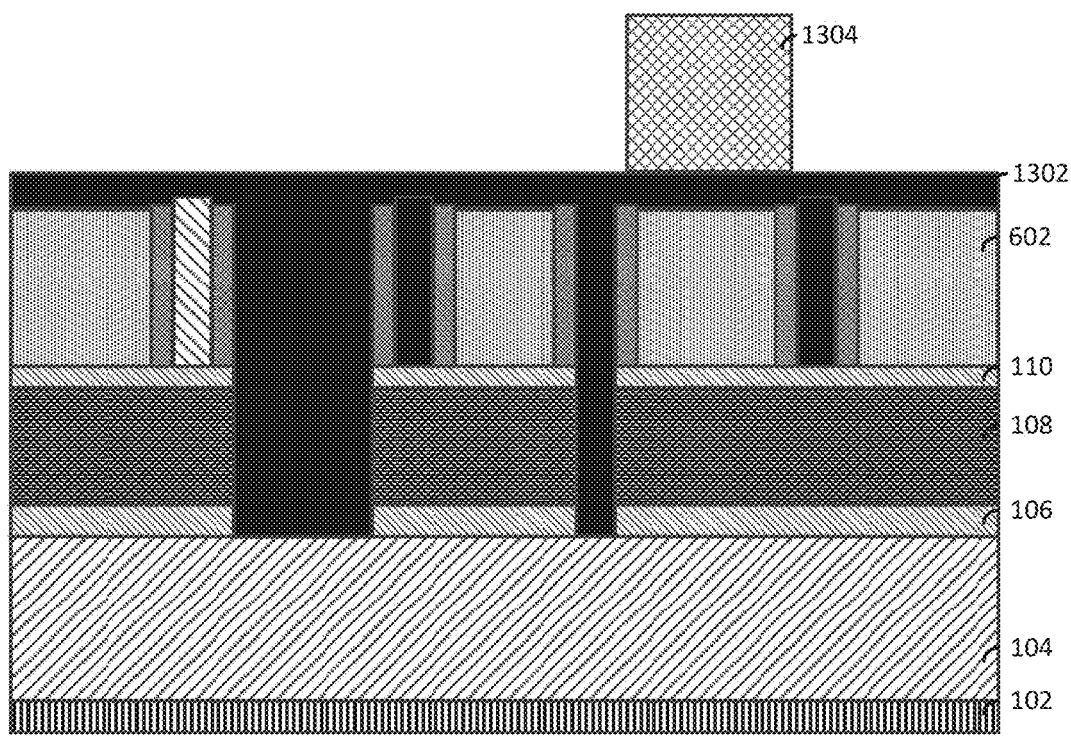
FIG. 13A illustrates a cut-away view along the line A-A (of FIG. 13B) following the deposition of a mask.
Figure 13B:
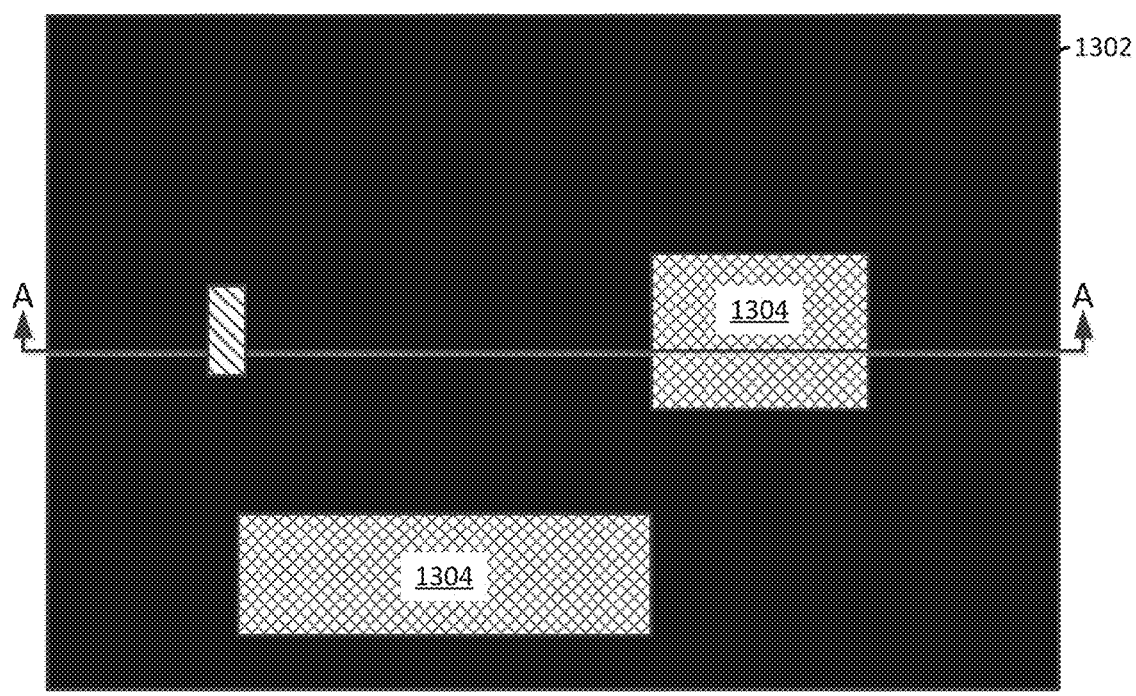
FIG. 13B illustrates a top view of the mask and the resist.

FIG. 13A illustrates a cut-away view along the line A-A (of FIG. 13B) following the deposition of a mask 1302 that fills cavities formed by the removal of the sacrificial mandrels 202 in FIG. 12. Following the deposition of the mask 1302, a resist 1304 is patterned on the mask 1302. FIG. 13B illustrates a top view of the mask 1302 and the resist 1304.

Figure 14A:
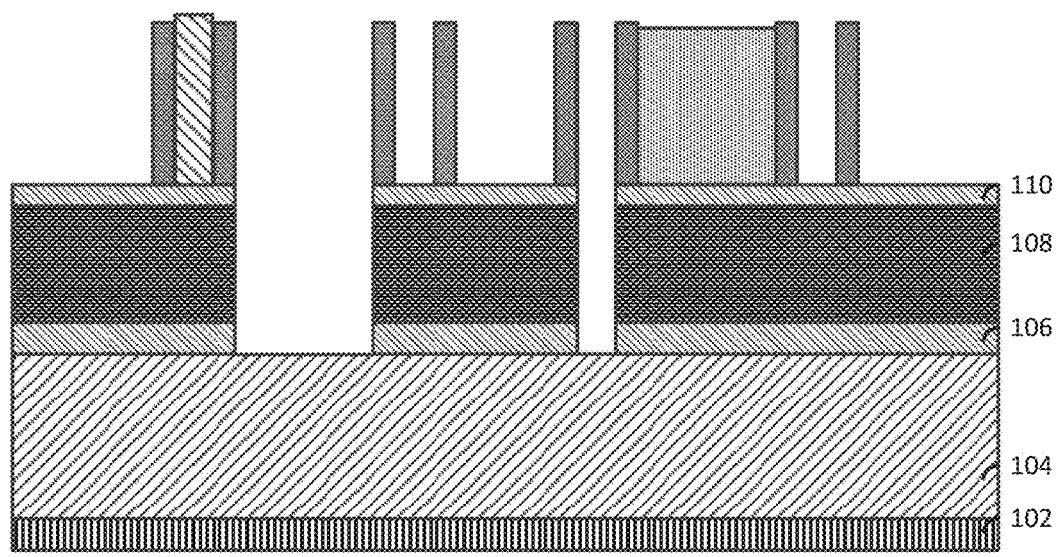
FIG. 14A illustrates a cut-away view along the line A-A (of FIG. 14B) following a selective etching process.
Figure 14B:
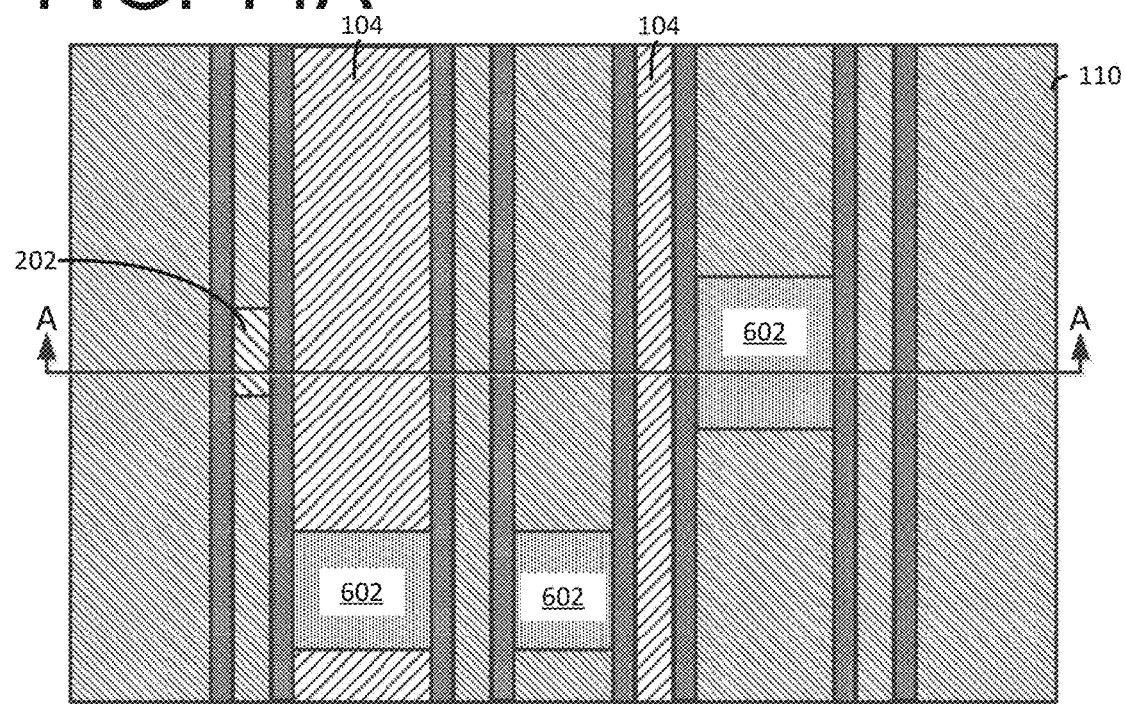
FIG. 14B illustrates a top view following the selective etching process.

FIG. 14A illustrates a cut-away view along the line A-A (of FIG. 14B) following a selective etching process that removes exposed portions of the mask 1302 material and the non-mandrel lines 602 (of FIG. 13A). FIG. 14B illustrates a top view following the selective etching process described above.

Figure 15:
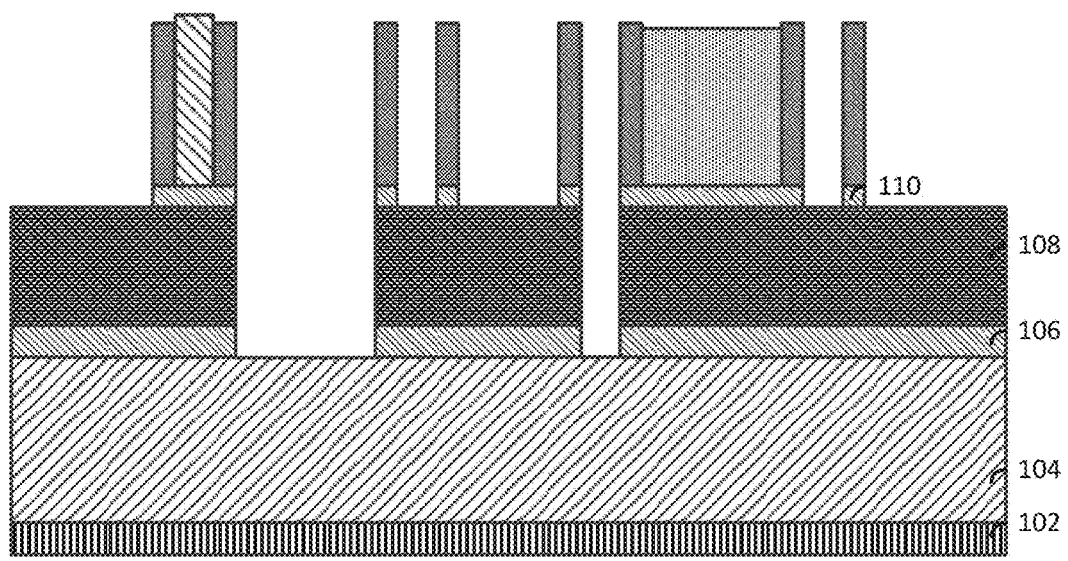

FIG. 15 illustrates a cut-away view following a selective etching process that removes exposed portions of the second hardmask 110 using a suitable anisotropic etching process such as, for example, reactive ion etching that exposes portions of the organic planarizing layer 108.

Figure 16:
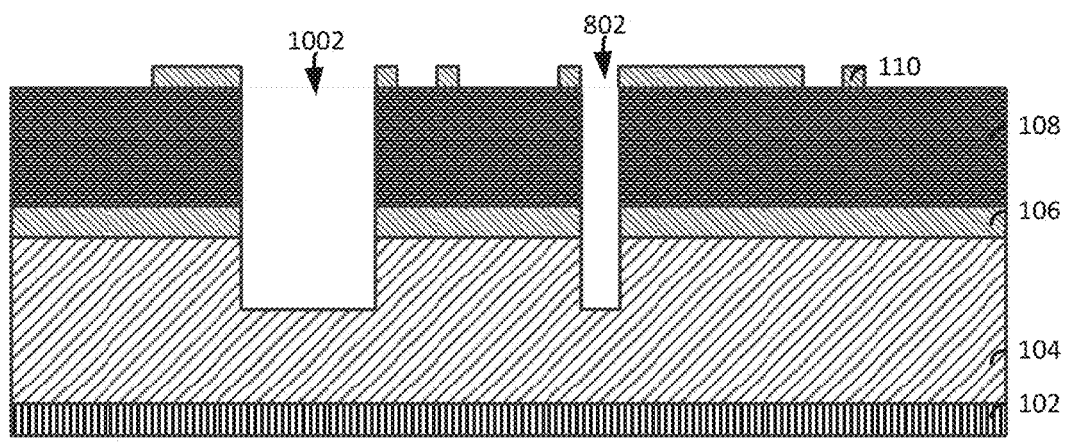

FIG. 16 illustrates a cut-away view following an etching process that removes the remaining features above the second hardmask 110 and selectively removes exposed portions of the inter-level dielectric layer 104 to increase the depth of the cavities 802 and 1002.

Figure 17:
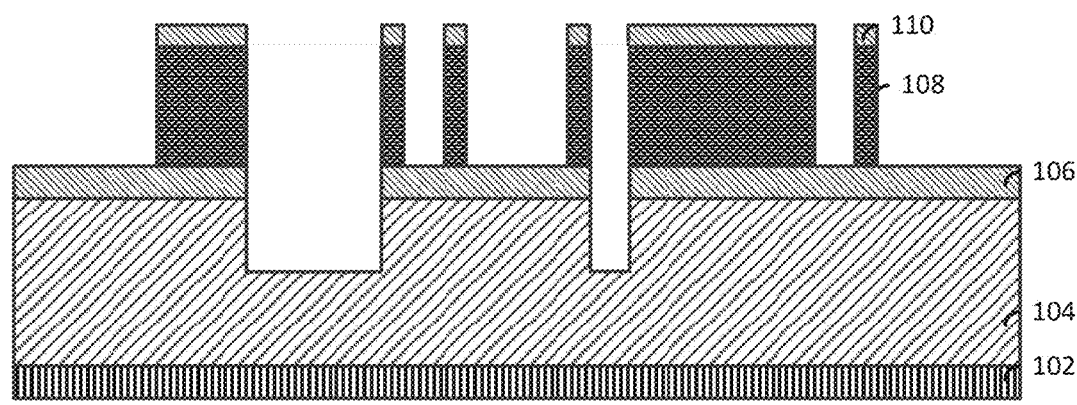

FIG. 17 illustrates a cut-away view of the resultant structure following a selective etching process such as, for example, reactive ion etching. The etching process removes exposed portions of the organic planarizing layer 108 to expose portions of the first hardmask 106.

Figure 18:
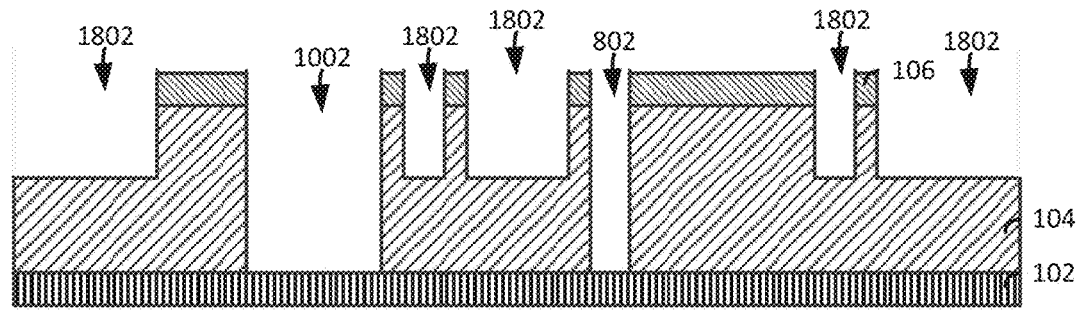

FIG. 18 illustrates a cut-away view following the removal of the materials over the first hardmask 106 and a selective etching process such as, for example, reactive ion etching. The etching process further increases the depth of the cavities 802 and 1002 to expose the conductive line 102. The etching process also forms trenches 1802 by removing exposed portions of the inter-level dielectric layer 104.

Figure 19:
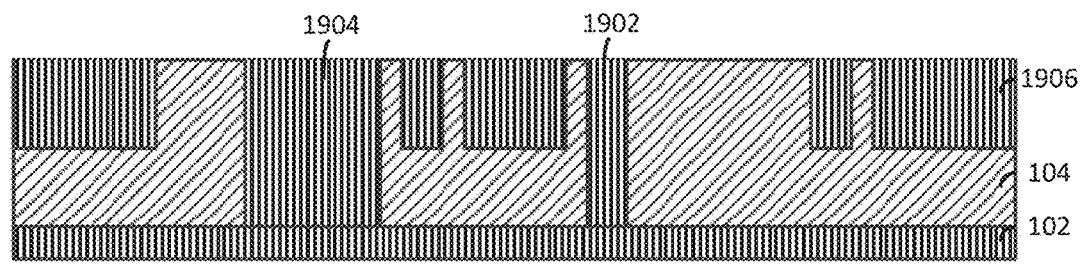
Figure 20:
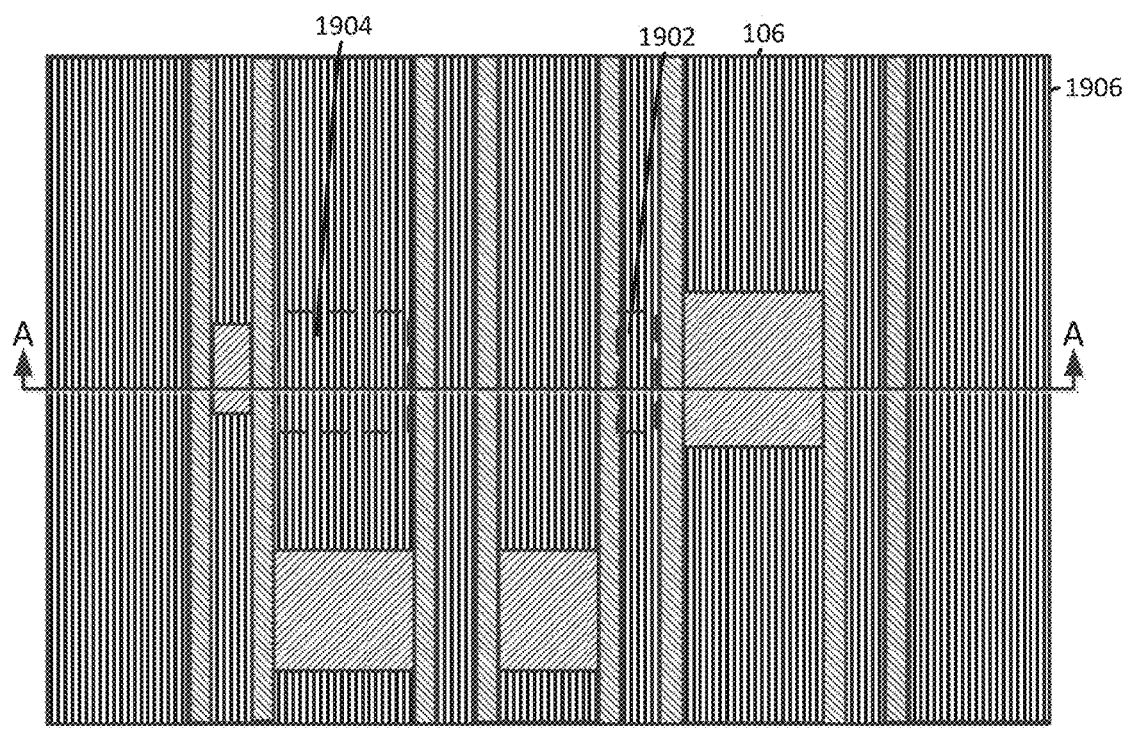

FIG. 19 illustrates a cut-away view along the line A-A (of FIG. 20) following the deposition of a conductive material such as, for example, copper, silver, gold, aluminum, or another conductive material into the cavities 802 and 1002, and into the trenches 1802. A planarization process such as, for example, chemical mechanical polishing may be performed to remove overburden material and form conductive vias 1902 and 1904 in the cavities 802 and 1002 respectively that contact the conductive line 102. The trenches 1802 (of FIG. 18) are filled to form conductive lines 1906. Prior to depositing the conductive material, a liner layer (not shown)

may be formed. FIG. 20 illustrates a top view of the resultant structure following the formation of the conductive lines 1906 and vias 1902 and 1904.

FIGS. 21-46 illustrate an exemplary embodiment of a method for forming conductive vias and conductive lines for a semiconductor device.

Figure 21:
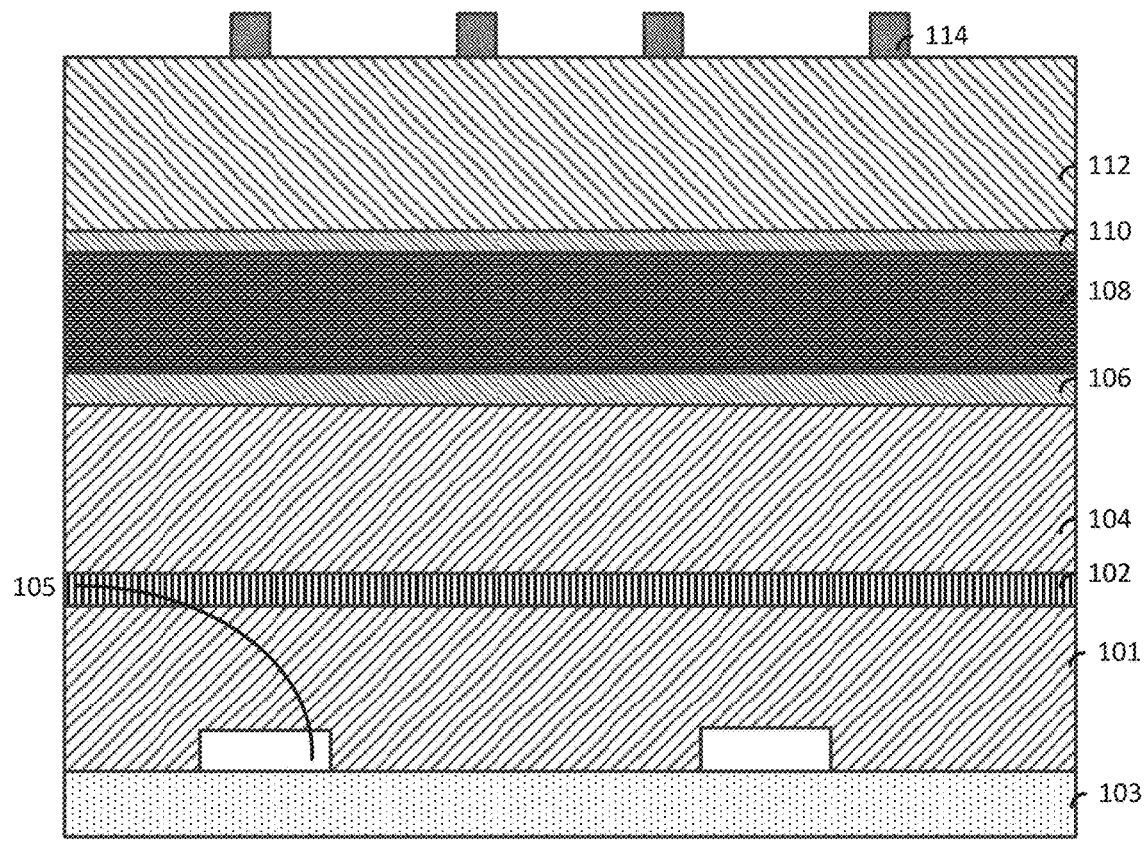

FIG. 21 illustrates a side view of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108. A sacrificial mandrel layer 112 is arranged on the second hardmask 110 and a resist 114 is patterned on the sacrificial mandrel layer 112.

Figure 22:
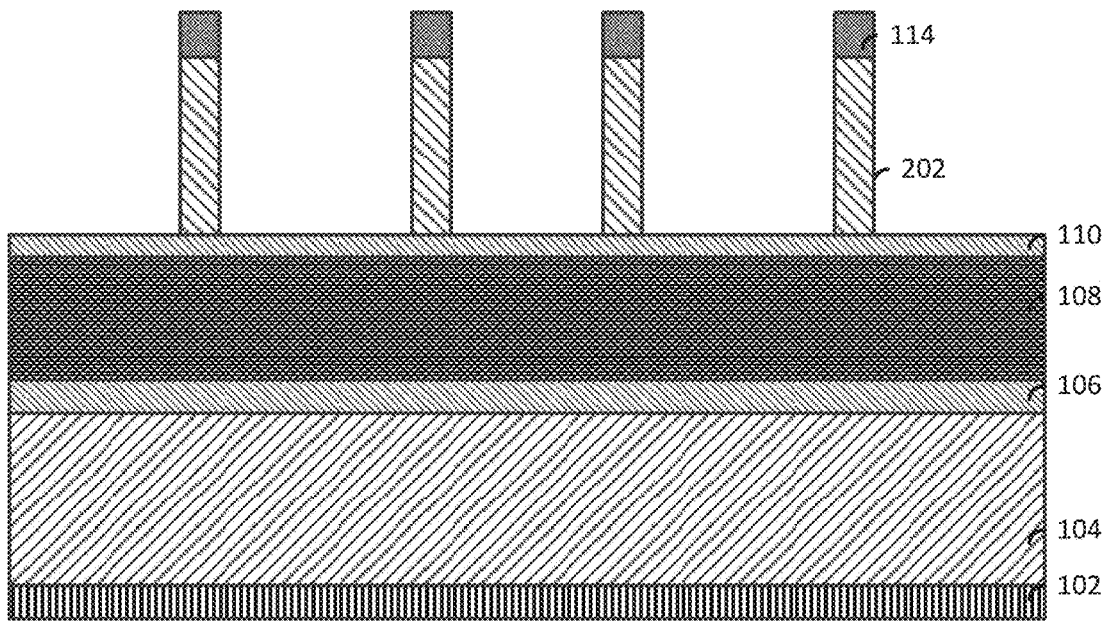

FIG. 22 illustrates a side view following the removal of portions of the sacrificial mandrel layer 112 to form sacrificial mandrels 202. The mandrels 202 may be formed by, for example, an etching process such as reactive ion etching. For simplicity and illustrative purposes, the substrate 103, the semiconductor devices 105, and the insulator layer 101 have been omitted from FIG. 2 and subsequent figures.

Figure 23:
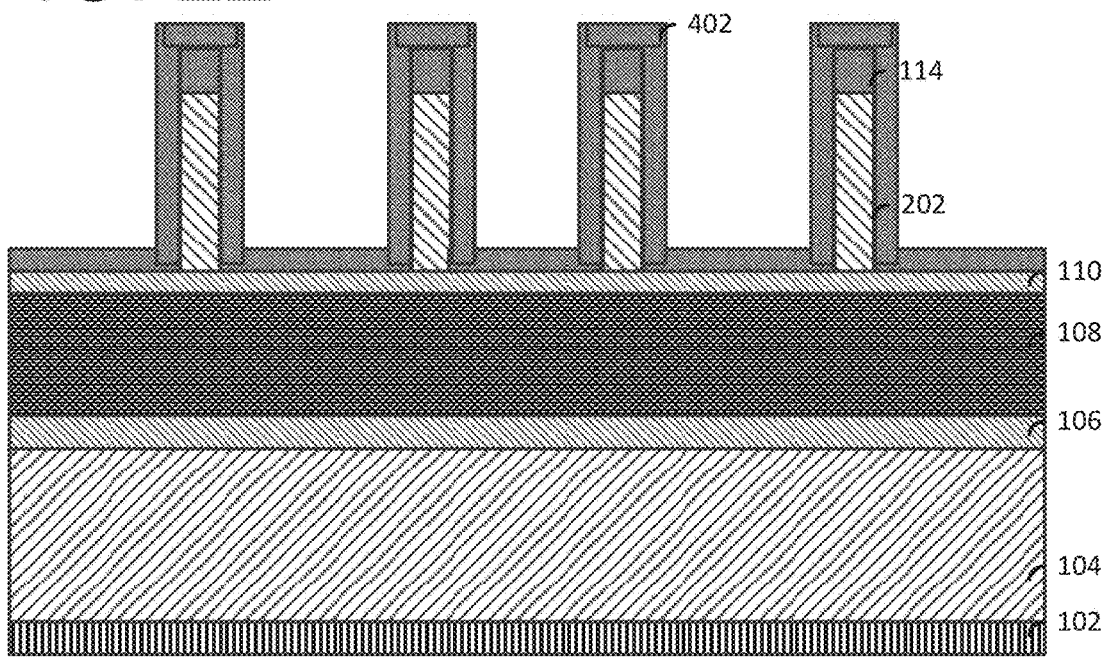

FIG. 23 illustrates a side view following the deposition of a layer of spacer material 402 over portions of the sacrificial mandrels 202 and the second hardmask 110. The layer of spacer material 402 may include, for example, a nitride or an oxide material.

Figure 24:
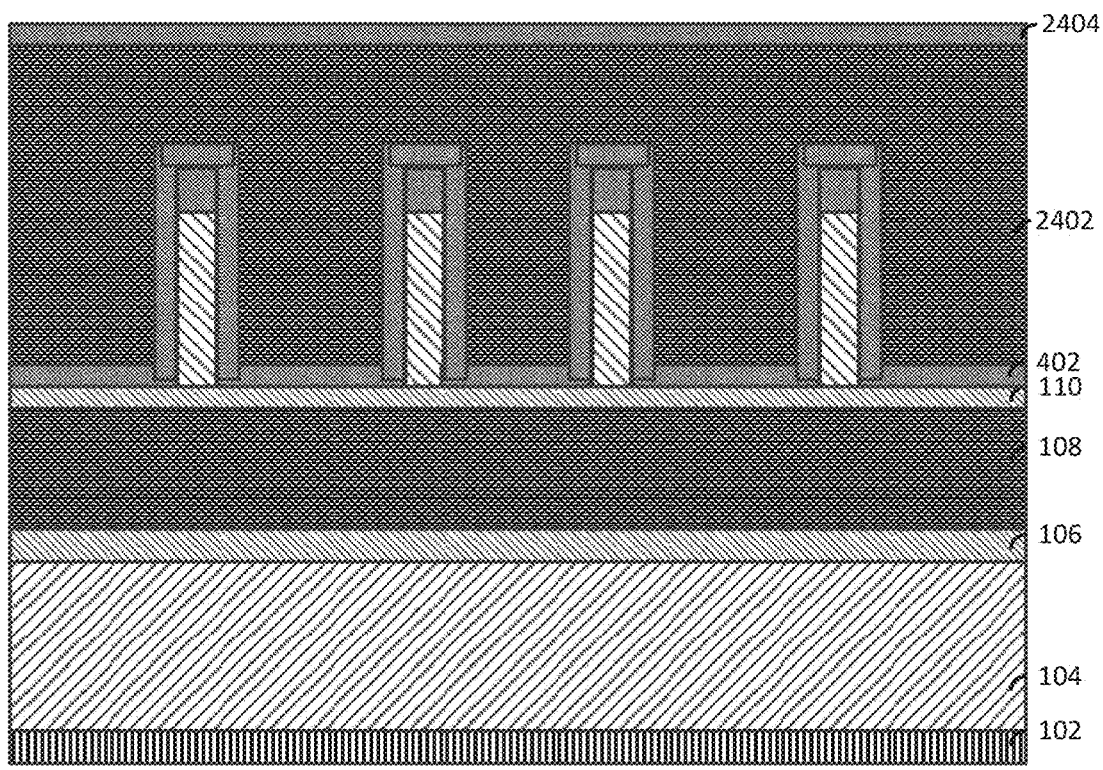

FIG. 24 illustrates a side view following the deposition of a filler layer 2402 over the layer of spacer material 402. The filler layer 2402 may include, for example, an organic planarizing material, a flowable carbide material, flowable oxide or another suitable filler material with the desired etch selectivity. Following the deposition of the filler layer 2402, a third hardmask 2404 is formed on the filler layer 2402. The third hardmask may include, for example, an oxide or nitride material.

Figure 25A:
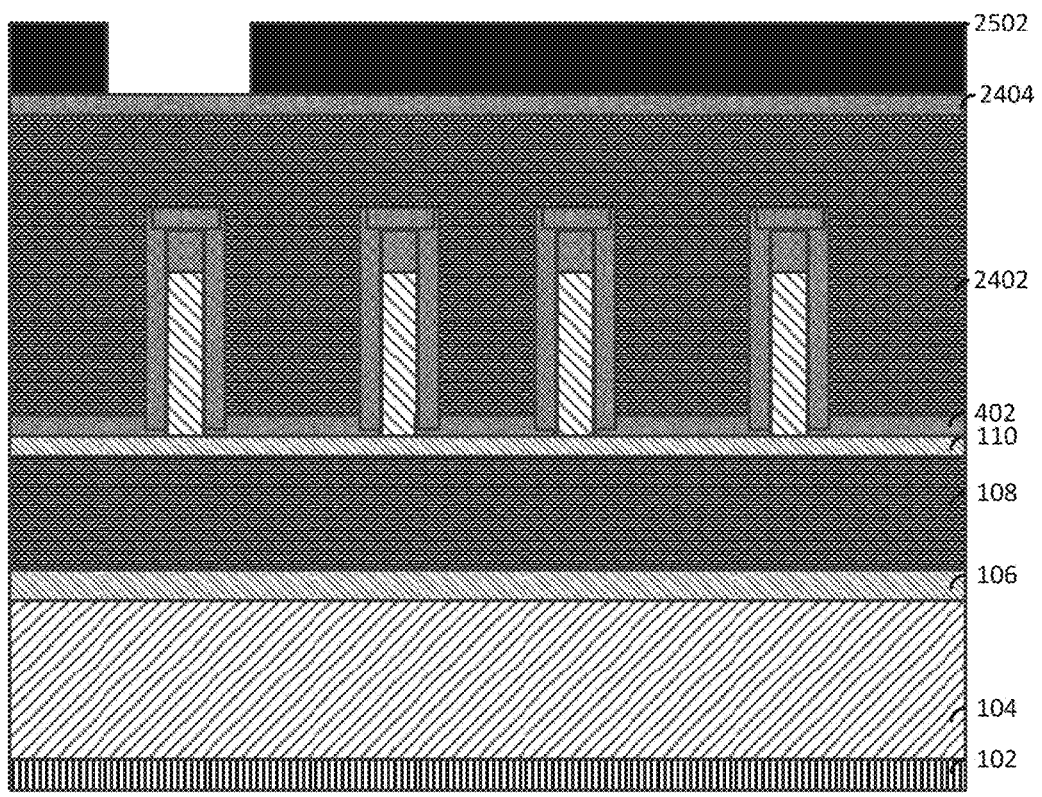
FIG. 25A illustrates a cut-away view along the line A-A (of FIG. 25B) following the patterning of a mask over the third hardmask.
Figure 25B:
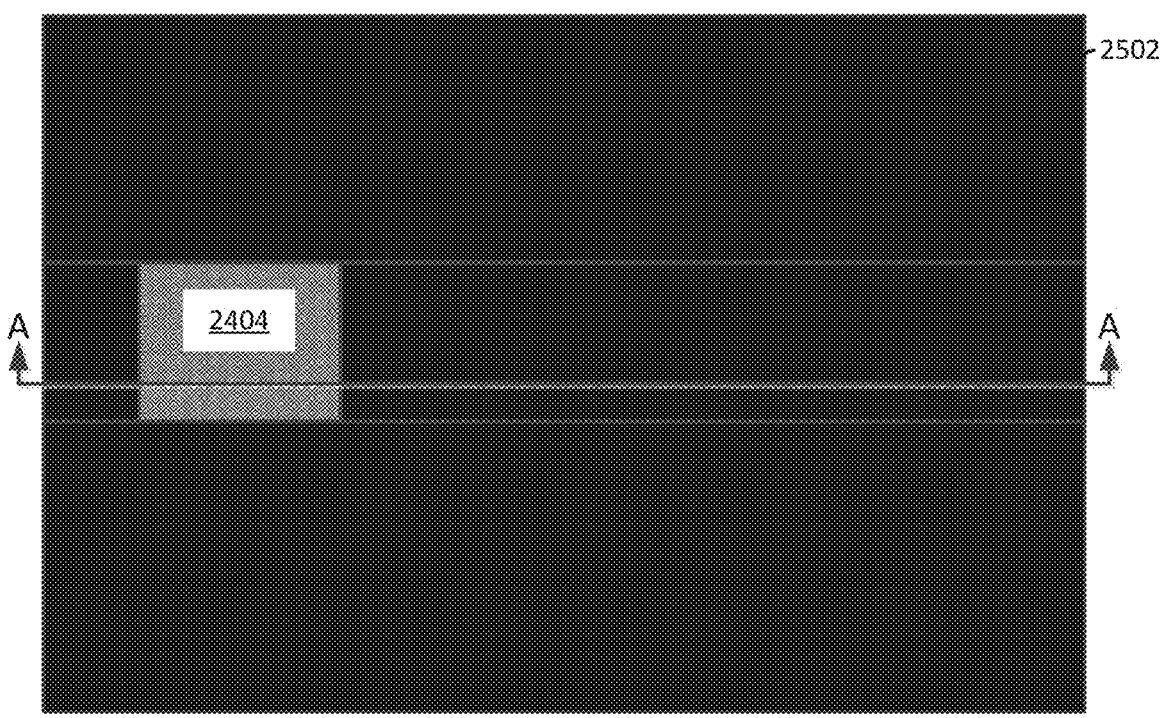
FIG. 25B illustrates a top view of the mask.

FIG. 25A illustrates a cut-away view along the line A-A (of FIG. 25B) following the patterning of a mask 2502 over the third hardmask 2404. FIG. 25B illustrates a top view of the mask 2502.

The mask 2502 is arranged to expose a portion of a desired sacrificial mandrel 202. Because the sacrificial mandrel 202 is formed from a material that is dissimilar from the materials used to form the spacers 502 and the non-mandrel lines 602, the alignment of the mask 2502 generally needs only be aligned to mask sacrificial mandrel 202 material that is not intended to be removed in the subsequent etching process (described below). Thus, the mask 2502 may be aligned within a margin of error that is substantially equal to the width of the non-mandrel lines 602 and spacers 502 adjacent to the mandrel line 202 that will be subsequently etched.

Figure 26:
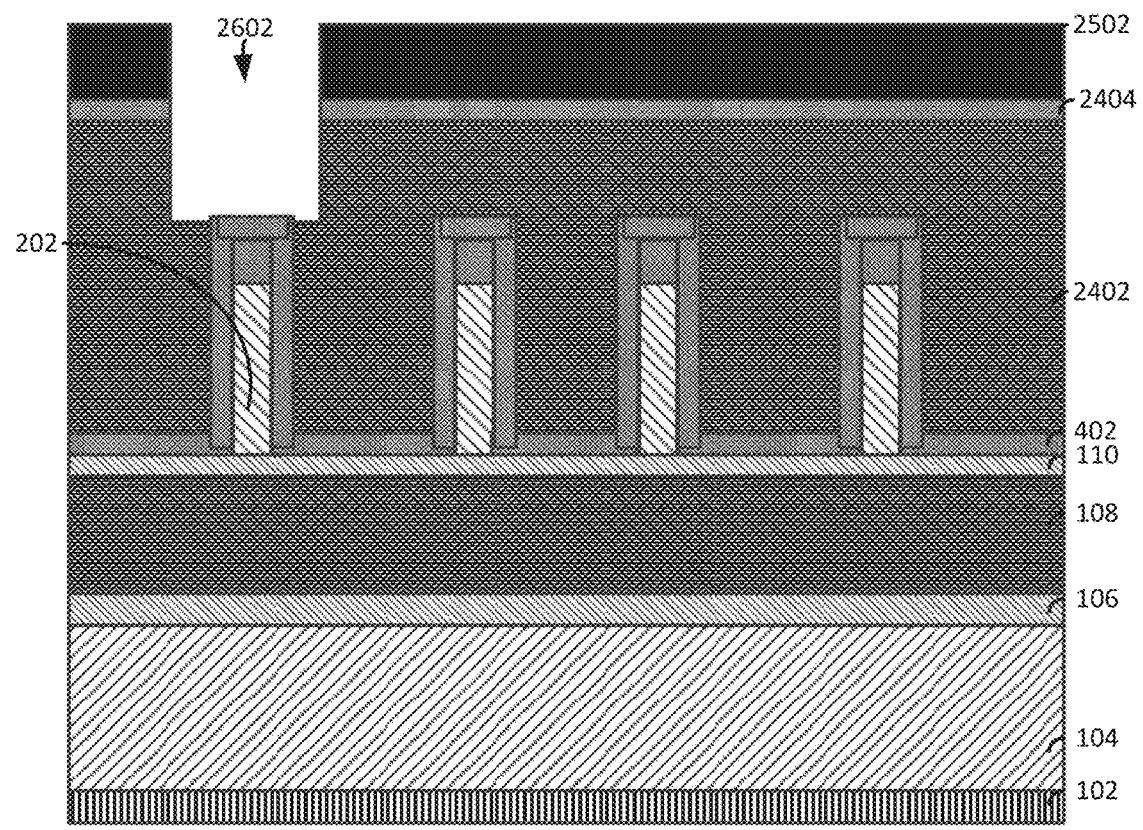

FIG. 26 illustrates a cut-away view following a selective etching process that removes exposed portions of the third hardmask 2402 and portions of the filler layer 2402 to expose a portion of the layer of spacer material 402 by forming a cavity 2602.

Figure 27A:
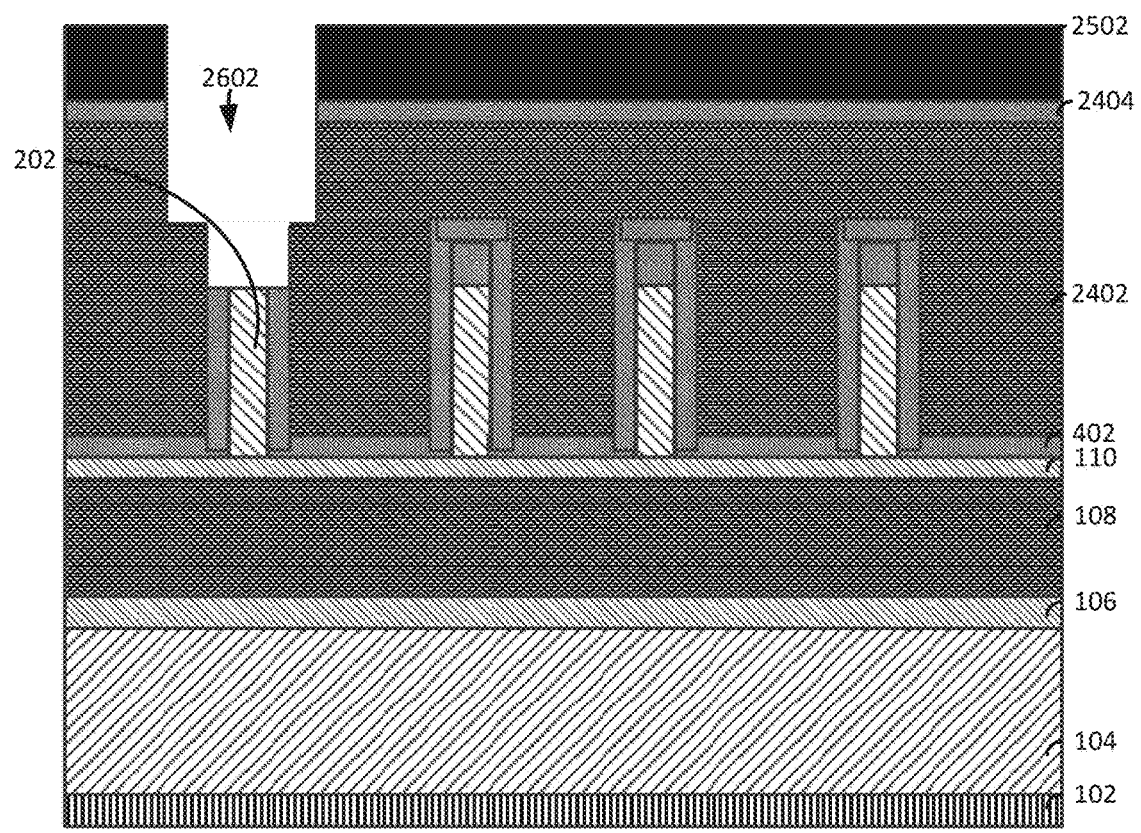
FIG. 27A illustrates a cut-away view along the line A-A (of FIG. 27B) following a selective etching process.
Figure 27B:
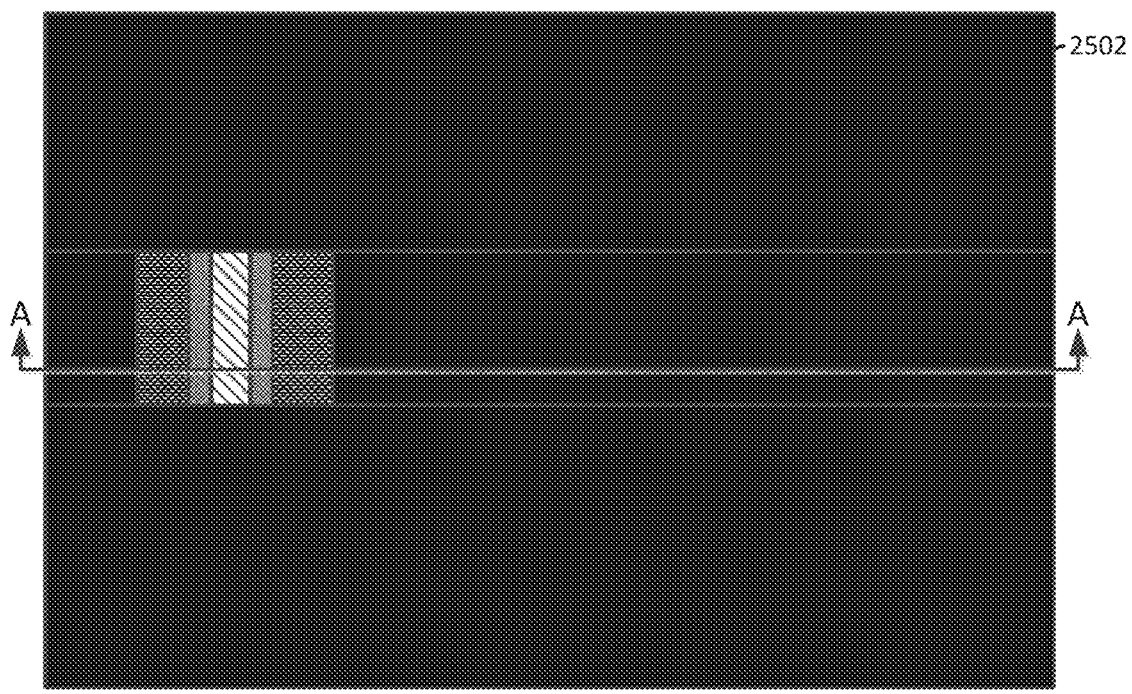
FIG. 27B illustrates a top view of the cavity.

FIG. 27A illustrates a cut-away view along the line A-A (of FIG. 27B) following a selective etching process that removes an exposed portion of the layer of spacer material 402 to expose a portion of a mandrel 202 in the cavity 2602. FIG. 27B illustrates a top view of the cavity 2602.

Figure 28:
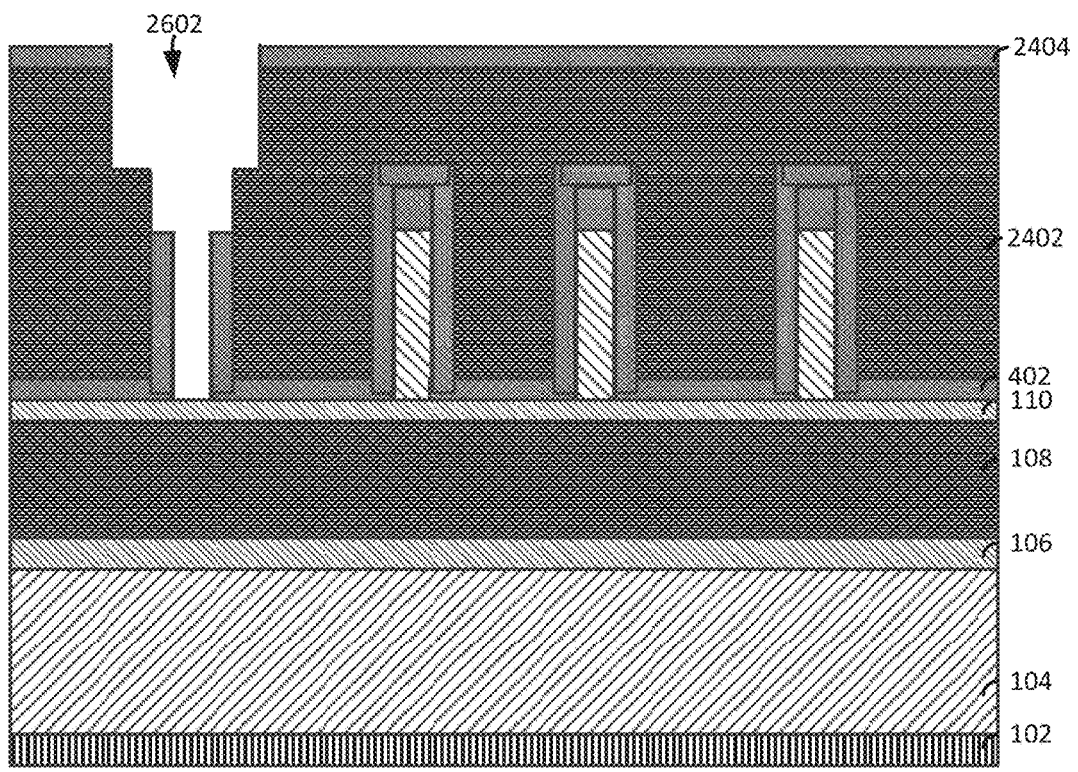

FIG. 28 illustrates a cut-away view following the removal of the exposed sacrificial mandrel 202 (of FIG. 27A). The removal of the sacrificial mandrel 202 increases the depth of the cavity 2602 and exposes the second hardmask 110. The mask 2502 may be removed using a suitable process such as, for example, ashing.

Figure 29:
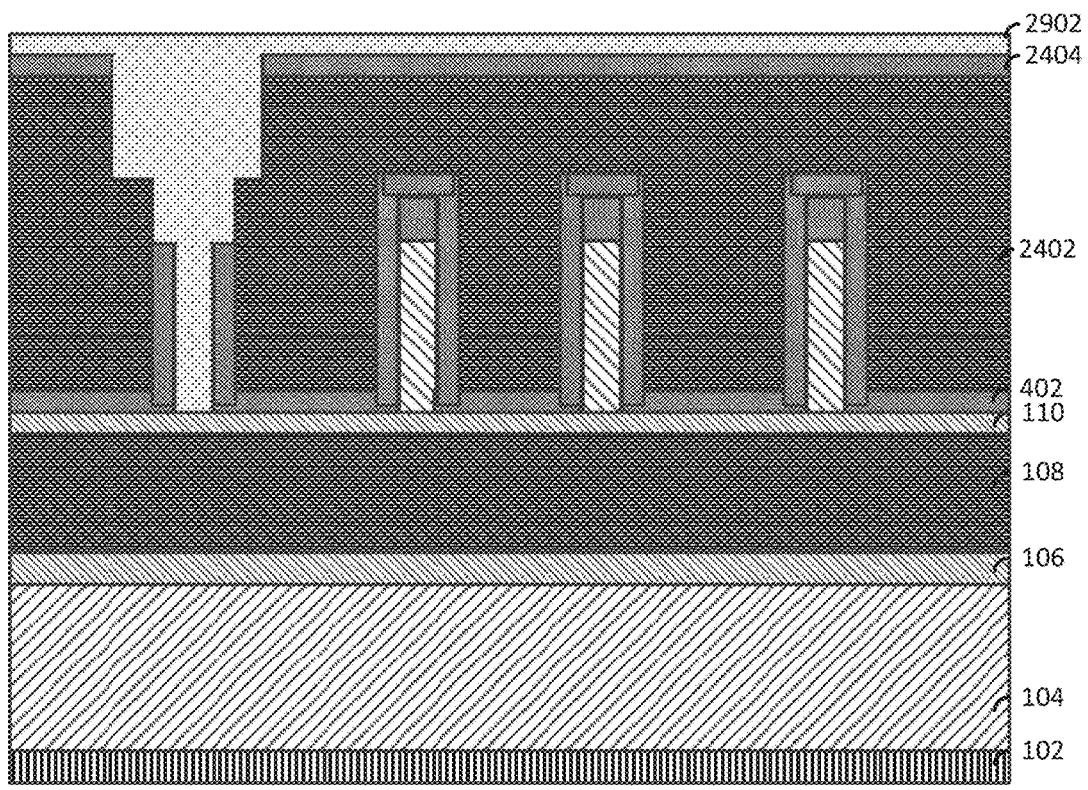

FIG. 29 illustrates the resultant structure following the deposition of another filler layer 2902 that fills the cavity 2602. The filler layer 2902 may include, for example, a conformal oxide, a spin-on oxide, spin-on low-k dielectric or other suitable material that provides the desired etch selectivity.

Figure 30A:
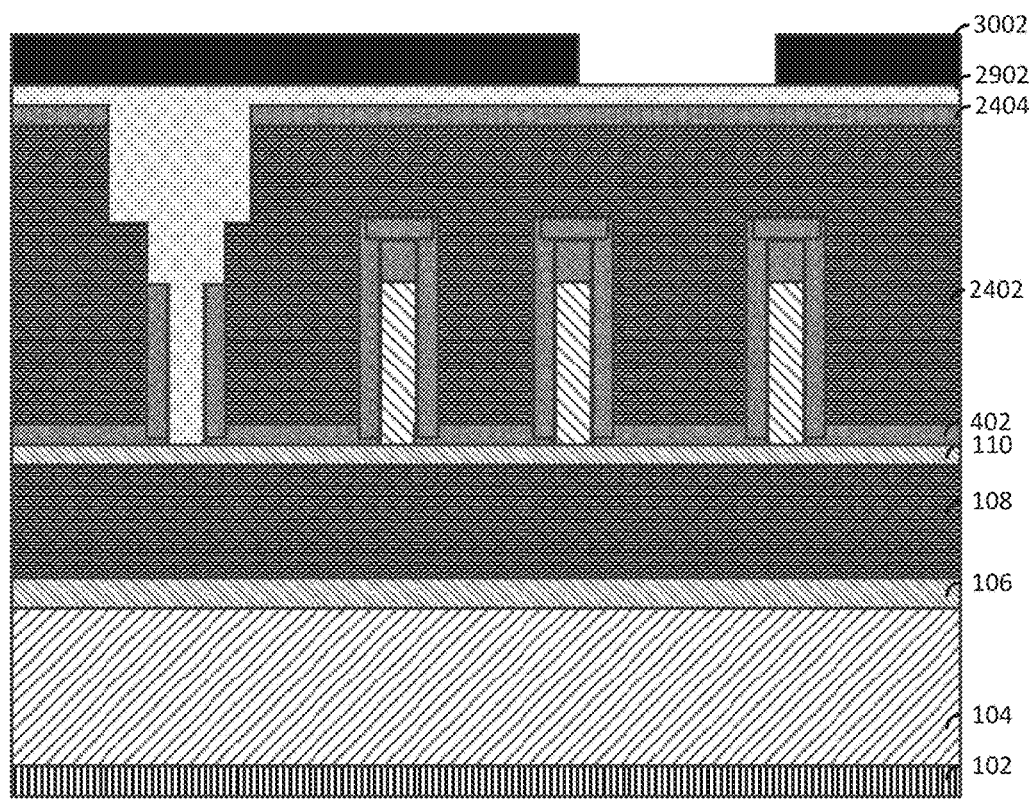
FIG. 30A illustrates a cut-away view along the line A-A (of FIG. 30B) following the patterning of a mask on the filler layer.
Figure 30B:
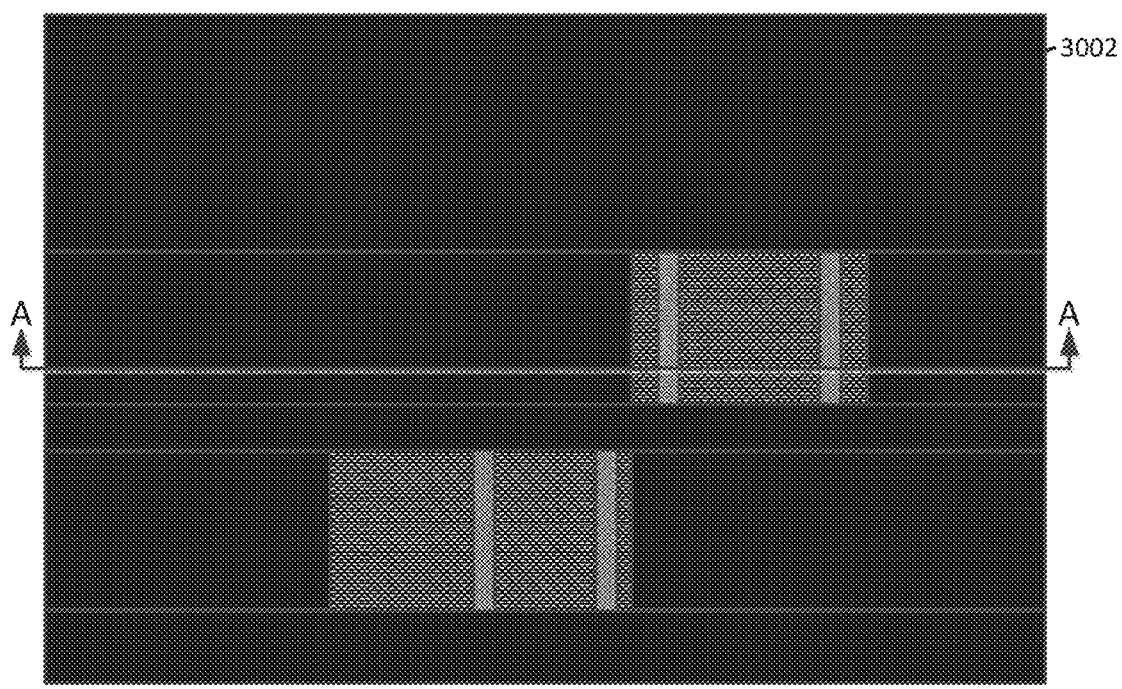
FIG. 30B illustrates a top view of the mask.

FIG. 30A illustrates a cut-away view along the line A-A (of FIG. 30B) following the patterning of a mask 3002 on the filler layer 2902. FIG. 30B illustrates a top view of the mask 3002.

The mask 3002 is arranged to expose a portion of a non-mandrel line 602 that will be removed in a subsequent etching process (described below). Because the non-mandrel line 602 is formed from a material that is dissimilar from the materials used to form the spacers 502 and the sacrificial mandrel lines 202, the alignment of the mask 3002 need only mask non-mandrel line 602 material that is not intended to be removed in the subsequent etching process. Thus, the margin for error in aligning the mask 3002 and other masks described below is greater than previous methods.

Figure 31:
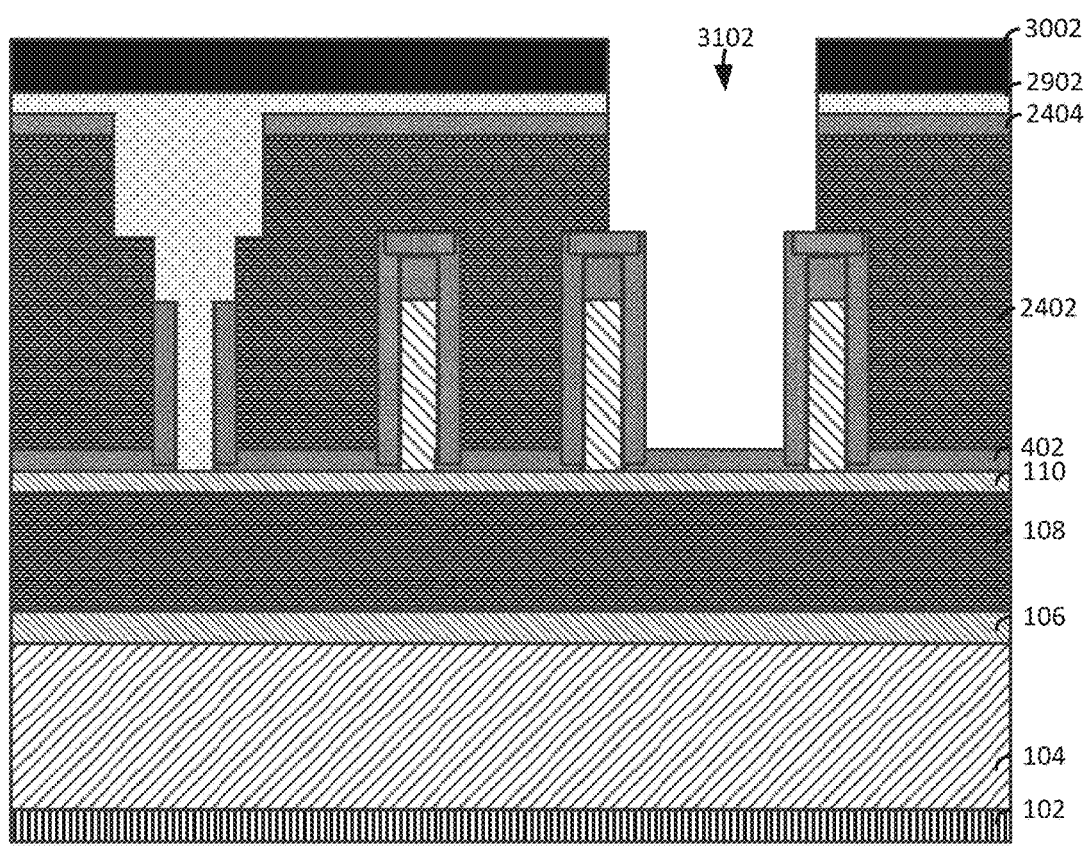

FIG. 31 illustrates a cut-away view following a selective etching process that removes exposed portions of the filler layer 2902, the hardmask 2404, and the filler layer 2402 to expose portions of the layer of spacer material 402 by forming a cavity 3102. The etching process may include, for example, a reactive ion etching process.

Figure 32:
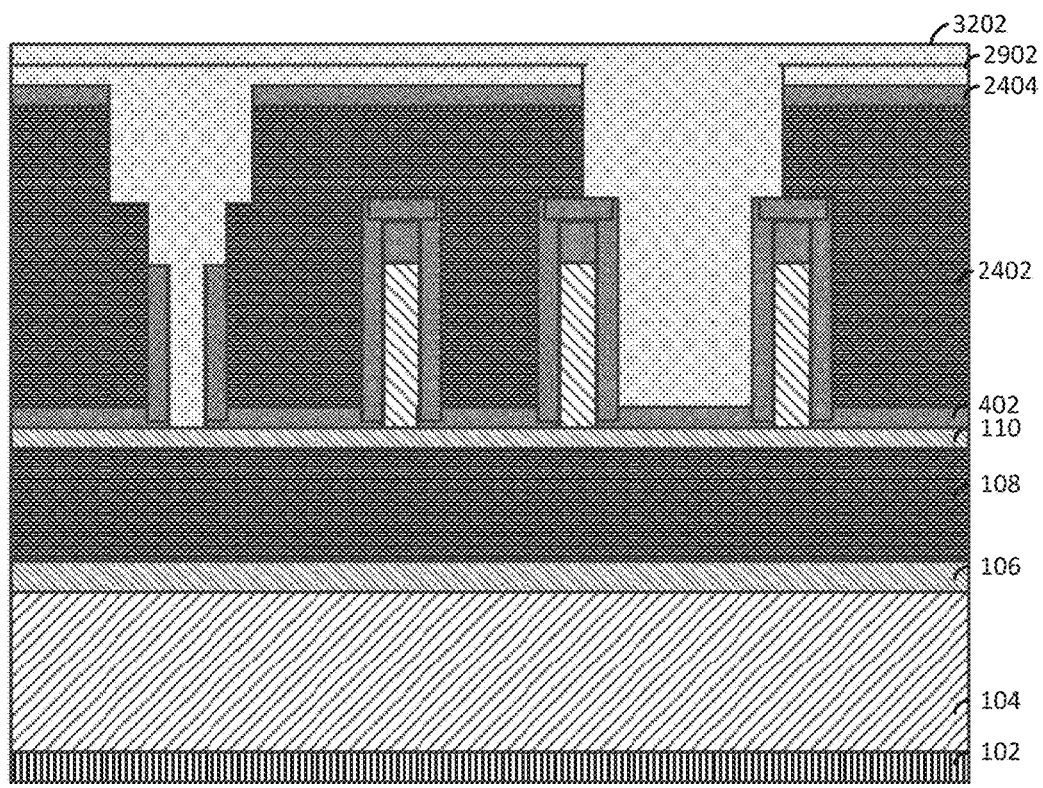

FIG. 32 illustrates a cut-away view following the deposition of a filler layer 3202 in the cavity 3102 (of FIG. 31). The filler layer 3202 may include, for example, a conformal oxide, a spin-on oxide, spin-on low-k dielectric or other suitable material that provides the desired etch selectivity. In the illustrated exemplary embodiment, the filler layer 3202 is a similar material as the filler layer 2902 (of FIG. 29). The mask 3002 (of FIG. 31) may be removed by a suitable process such as, for example, etching.

Figure 33:
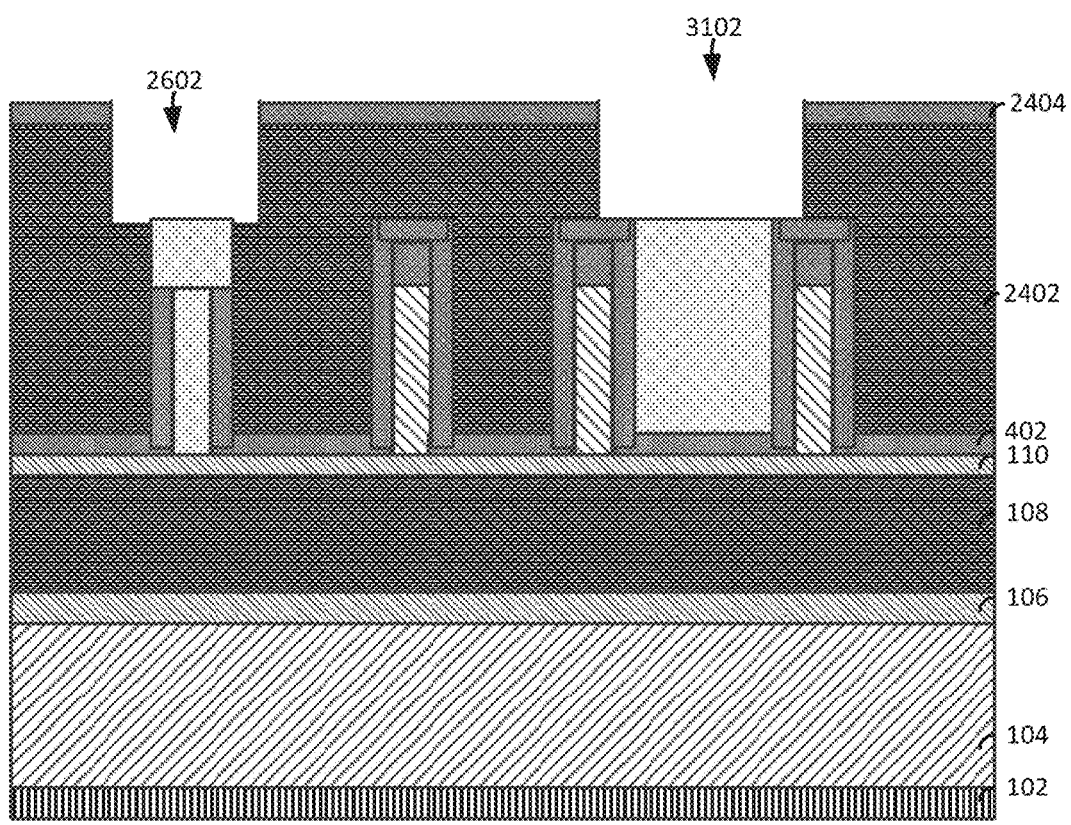

FIG. 33 illustrates a cut-away view following a selective etching process that removes exposed portions of the filler layer 3202 and the filler layer 2902. The removal of portions of the filler layer 2902 and the filler layer 3202 exposes portions of the cavities 3102 and 2602.

Figure 34:
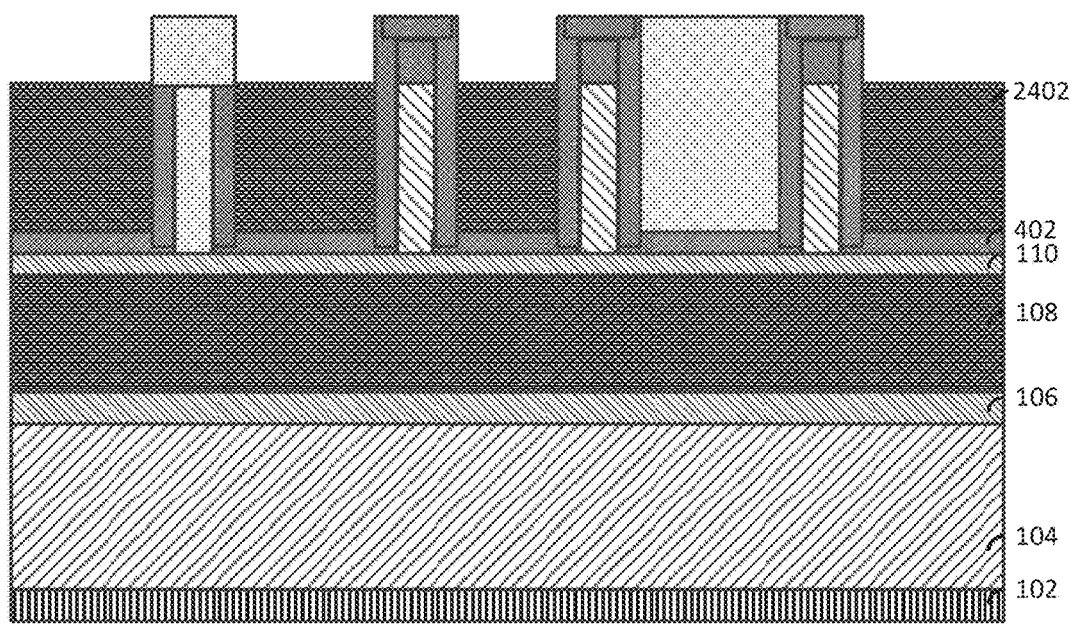

FIG. 34 illustrates a cut-away view following a selective etching process that removes the third hardmask 2404 and portions of the fill material 2402 to expose portions of the layer of spacer material 402 and portions of the fill material 2402. The etching process may include, for example, a selective ion etch, or a wet etching process with the desired selectivity.

Figure 35:
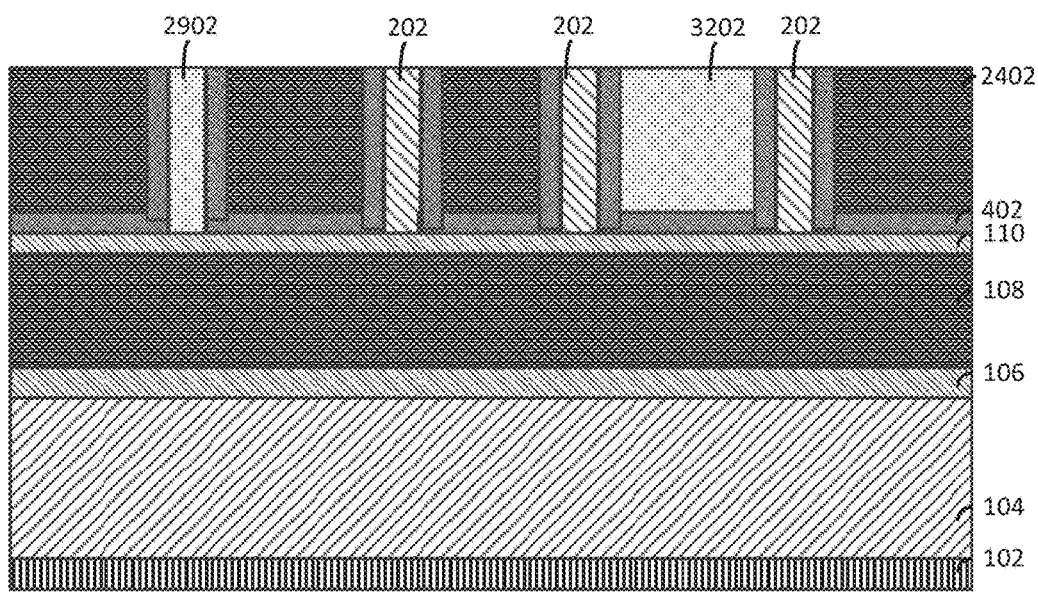

FIG. 35 illustrates a cut-away view following an etching process that removes exposed portions of the layer of spacer material 402 to expose the sacrificial mandrels 202. The exposed portions of the layer of spacer material 402 may be removed by, for example, a reactive ion etching process.

Figure 36A:
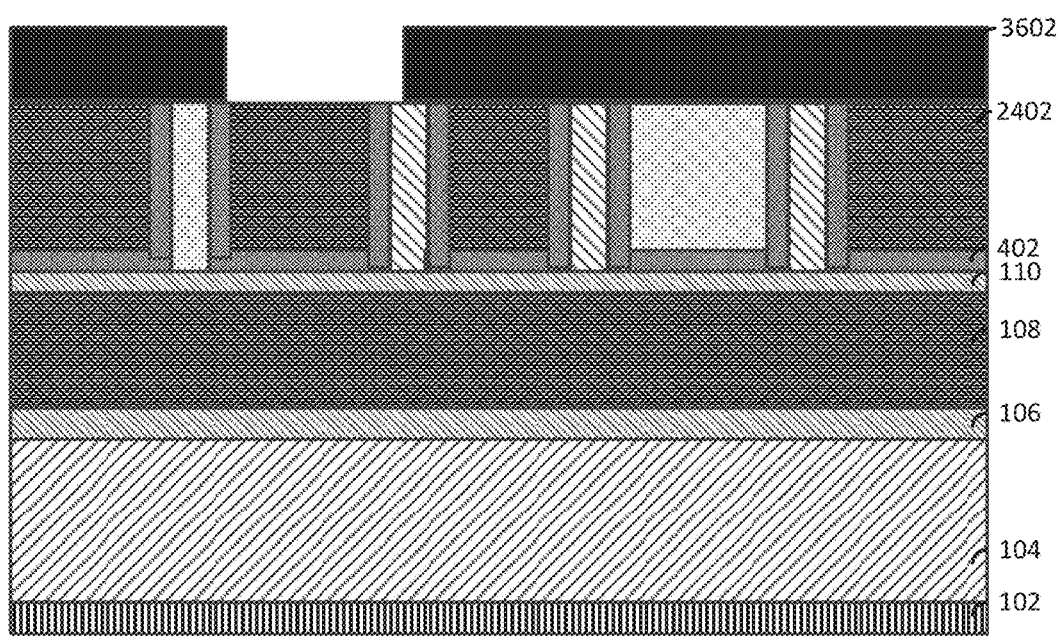
FIG. 36A illustrates a cut-away view along the line A-A (of FIG. 36B) following the patterning of a mask.
Figure 36B:
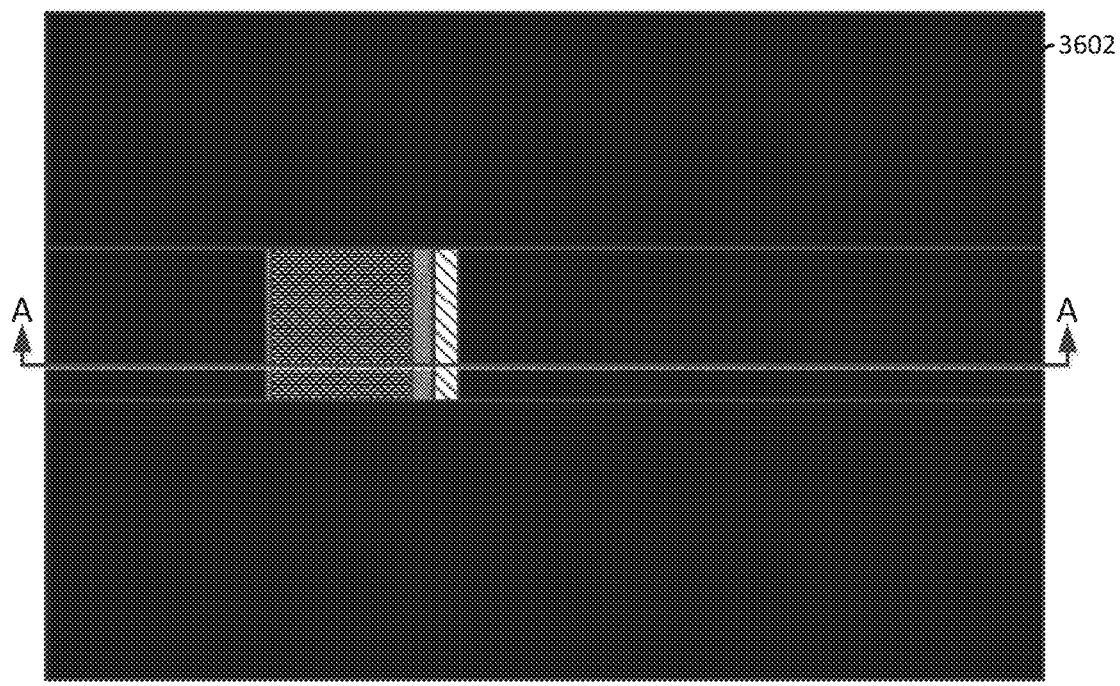
FIG. 36B illustrates a top view of the mask.

FIG. 36A illustrates a cut-away view along the line A-A (of FIG. 36B) following the patterning of a mask 3602 over portions of the filler layer 2402, the sacrificial mandrels 202 and the layer of spacer material 402. FIG. 36B illustrates a top view of the mask 3602.

Figure 37:
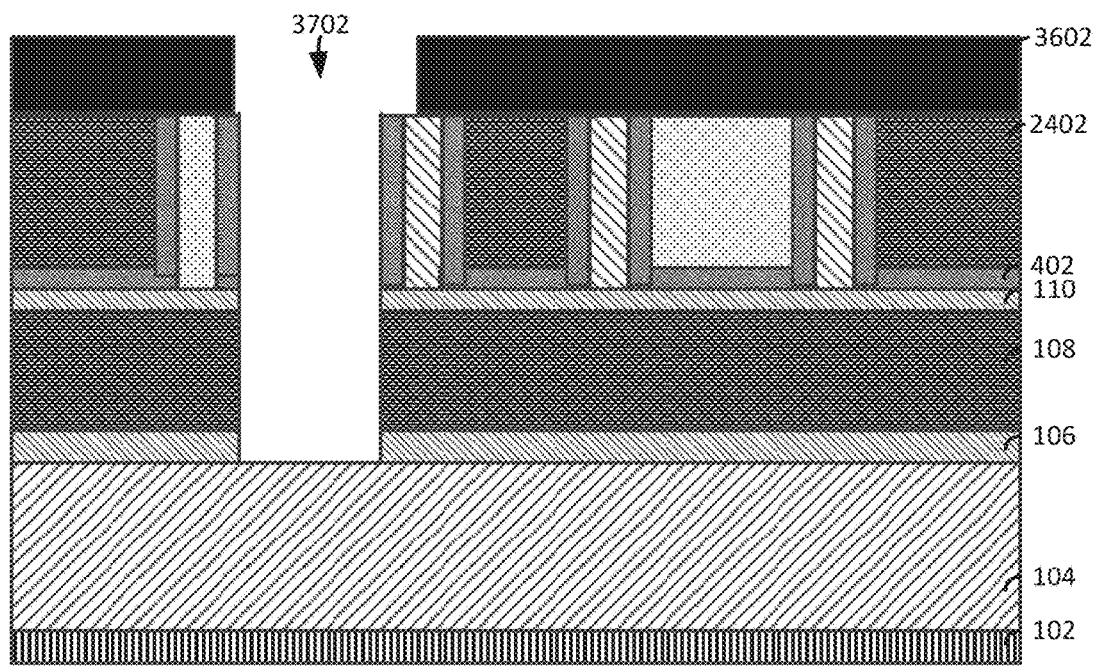

FIG. 37 illustrates a cut-away view following a selective etching process. The selective etching process removes exposed portions of the filler layer 2402, the second hardmask 110, the organic planarizing layer 108, and the first hardmask 106. The selective etching process may include, for example, reactive ion etching and forms a cavity 3702 that exposes the inter-level dielectric layer 104.

Figure 38A:
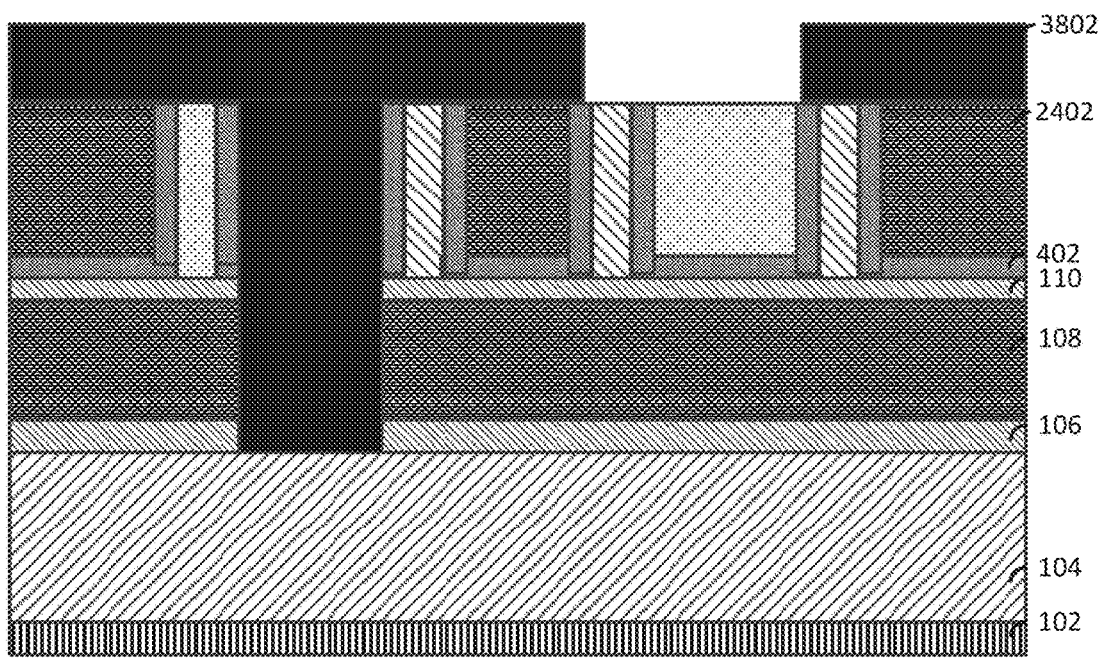
FIG. 38A illustrates a cut-away view along the line A-A (of FIG. 38B) following the patterning of a mask that fills the cavity.
Figure 38B:
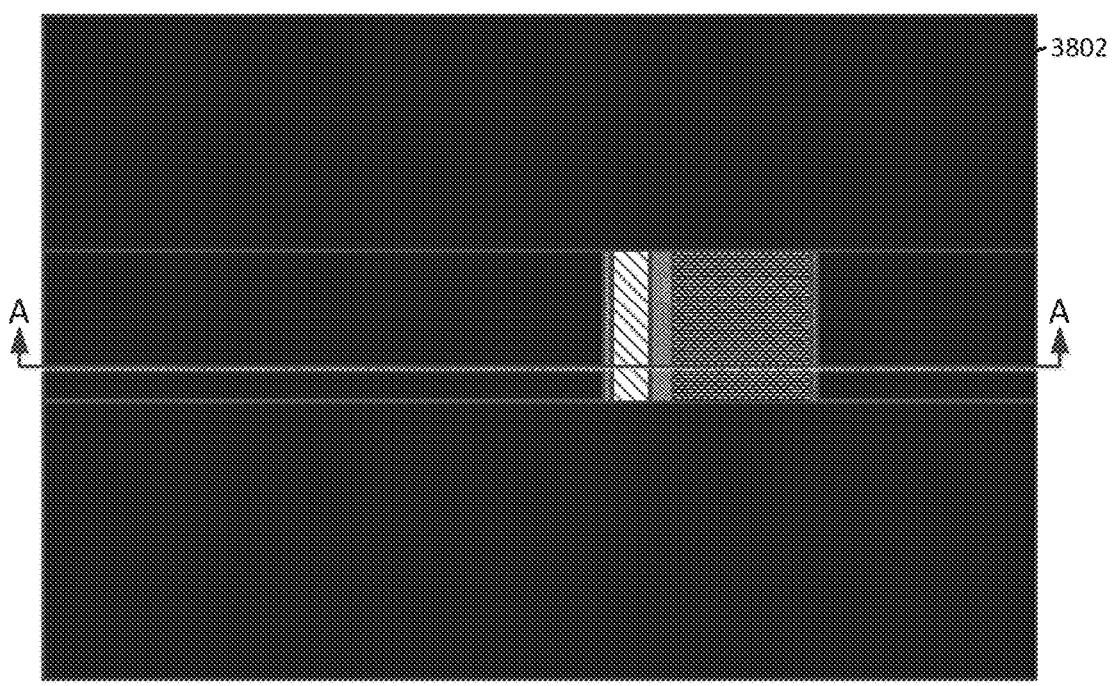
FIG. 38B illustrates a top view of the mask.

FIG. 38A illustrates a cut-away view along the line A-A (of FIG. 38B) following the patterning of a mask 3802 that fills the cavity 3702 (of FIG. 37). FIG. 38B illustrates a top view of the mask 3802.

Figure 39:
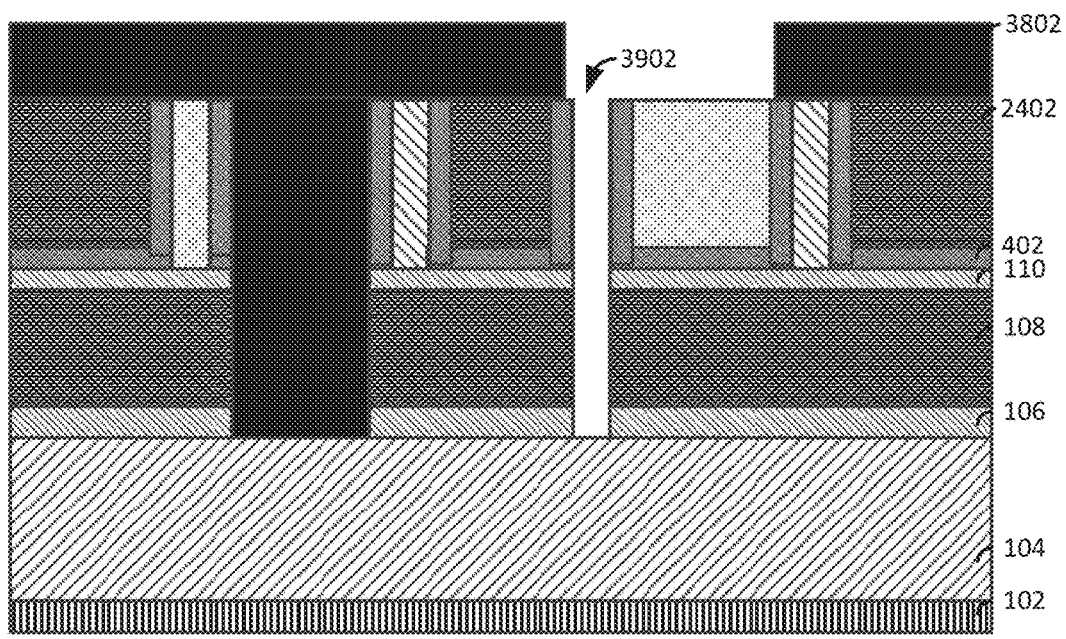

FIG. 39 illustrates a cut-away view following a selective etching process that removes exposed portions of the mandrel 202 to form a cavity 3902. The cavity 3902 may be formed by, for example, a reactive ion etching process that removes exposed portions of the mandrel 202, the second hardmask 110, the organic planarizing layer 108 and the first hardmask 106. The cavity 3902 exposes a portion of the inter-level dielectric layer 104.

Figure 40:
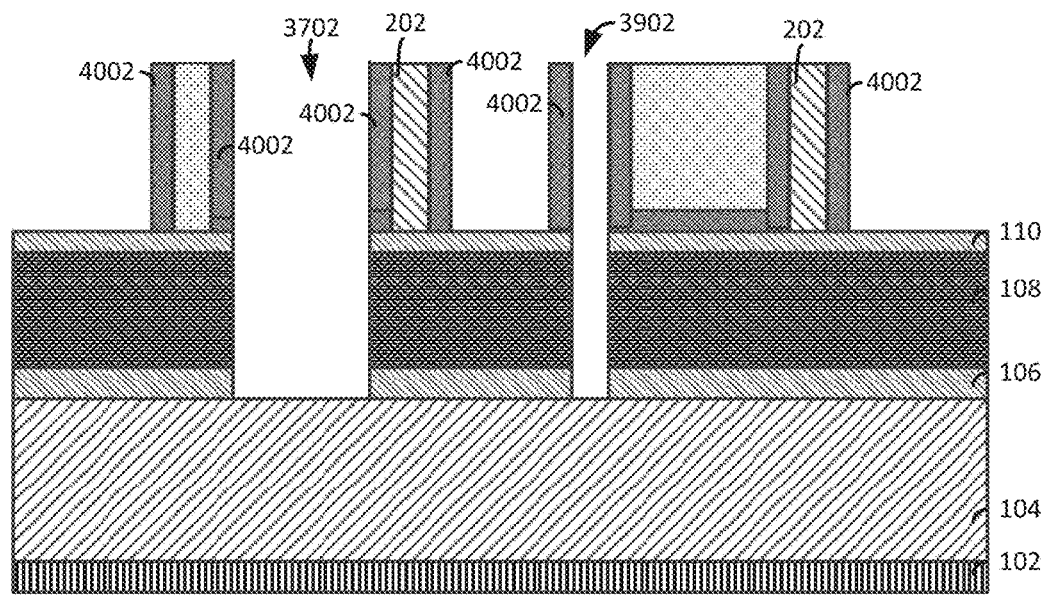

FIG. 40 illustrates a cut-away view following the removal of the mask 3802 using a suitable process such as, for example, ashing. After the mask 3802 is removed, cavity 3702 is exposed. The remaining filler layer 2404 (of FIG. 39) is removed using a suitable selective etching process to expose portions of the second hardmask 110. Exposed portions of the layer of spacer material 402 are removed to define the spacers 4002.

Figure 41:
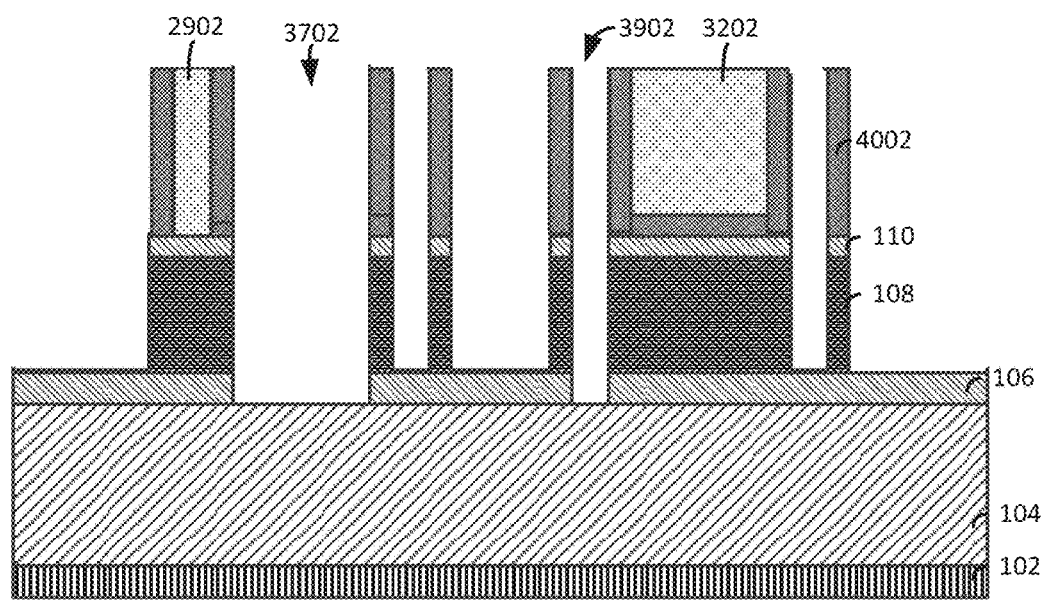

FIG. 41 illustrates a cut-away view following a selective etching process such as, for example, reactive ion etching. The etching process removes the sacrificial mandrel 202 (of FIG. 40) and exposed portions of the second hardmask 110 and the organic planarizing layer 108 to expose portions of the first hardmask 106.

Figure 42:
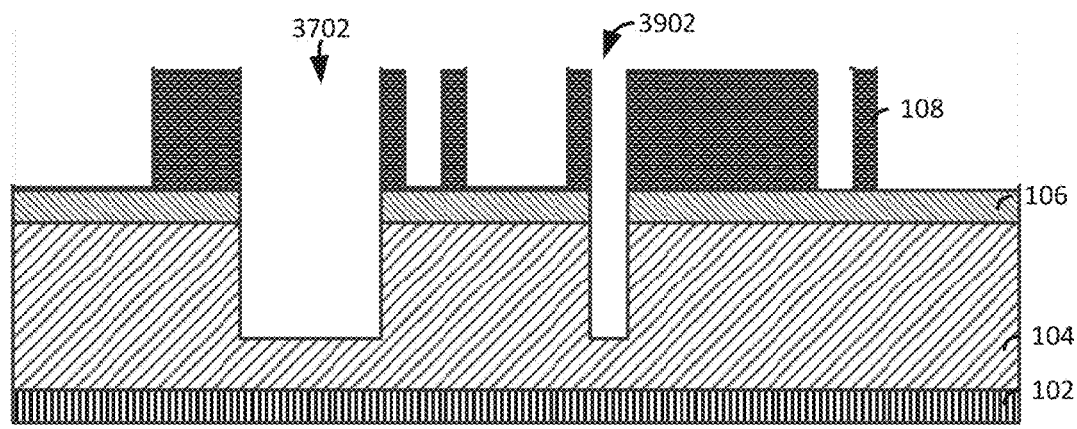

FIG. 42 illustrates a cut-away view of the resultant structure following an etching process that removes the spacers 4002, the filler layer 2902, the filler layer 3202, and the second hardmask 110 (of FIG. 41). The etching process removes exposed portions of the inter-level dielectric layer 104 to further increase the depth of the cavities 3702 and 3902.

Figure 43:
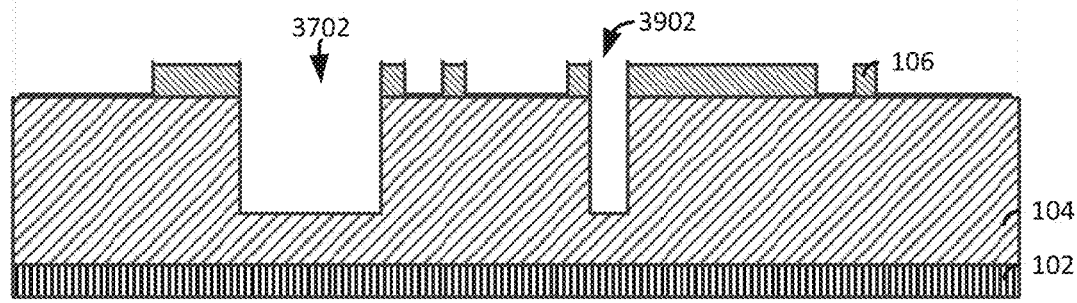

FIG. 43 illustrates a cut-away view of the resultant structure following the removal of the remaining organic planarization layer 108 (of FIG. 42) to further expose the first hardmask 106. Selective reactive ions etching, for example, can be used to etch the organic planarization layer and the first hardmask.

Figure 44:
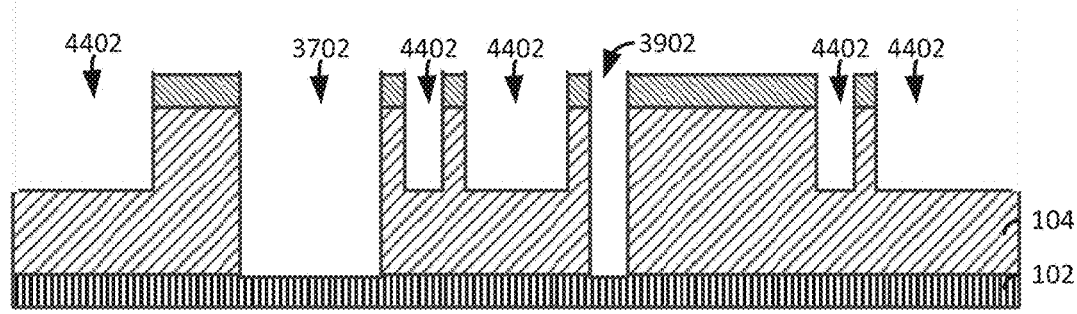

FIG. 44 illustrates a cut-away view of the resultant structure following a selective anisotropic etching process such as, for example, reactive ion etching. The etching process removes exposed portions of the inter-level dielectric layer 104 to form trenches 4402 and to increase the depth of the cavities 3702 and 3902. The cavities 3702 and 3902 expose portions of the conductive line 102.

Figure 45:
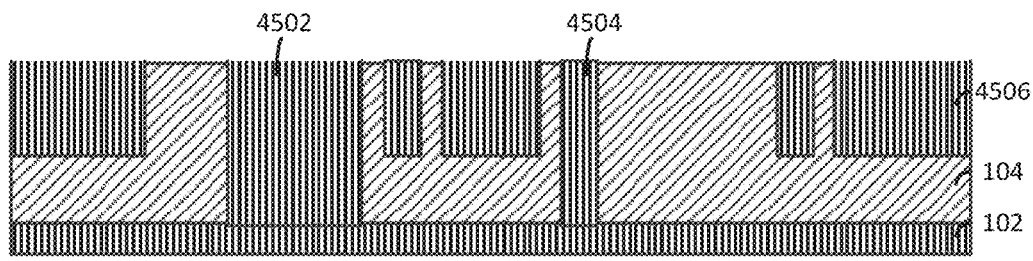
Figure 46:
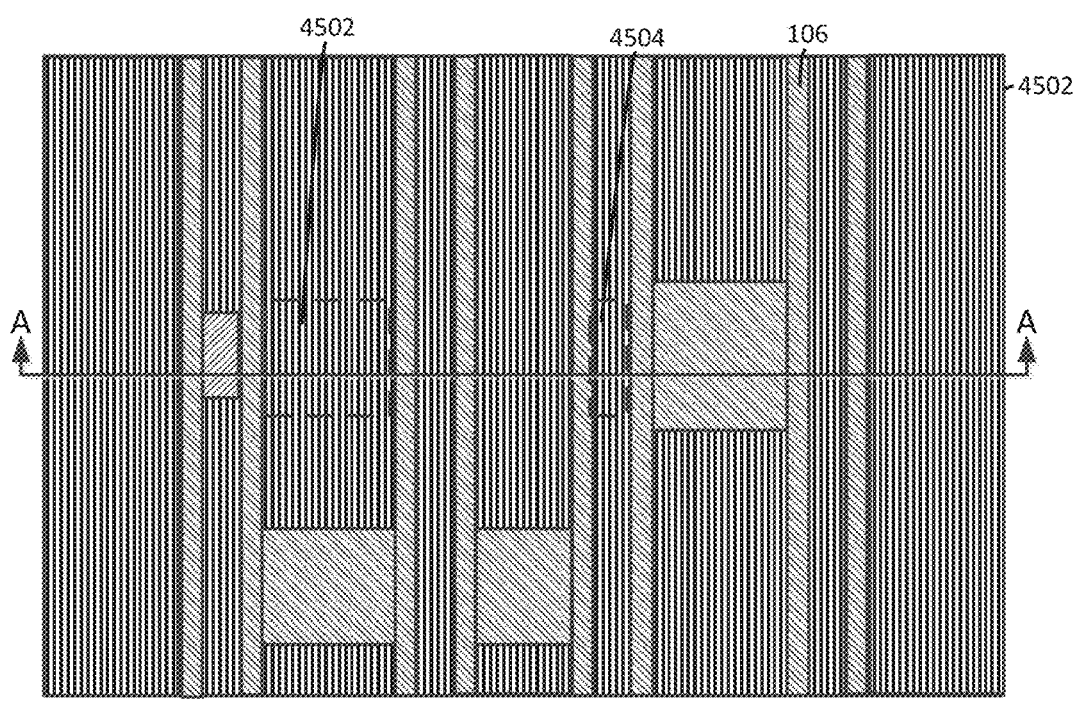

FIG. 45 illustrates a cut-away view along the line A-A (of FIG. 46) following the deposition of a conductive material such as, for example, copper, silver, gold, aluminum, or another conductive material into the cavities 3702 and 3902, and into the trenches 4402 (of FIG. 44). A planarization process such as, for example, chemical mechanical polishing may be performed to remove overburden material and form conductive vias 4502 and 4504 in the cavities 3702 and 3902 respectively that contact the conductive line 102. The trenches 4402 (of FIG. 44) are filled to form conductive lines 4506. Prior to depositing the conductive material, a liner layer (not shown) may be formed. FIG. 46 illustrates a top view of the resultant structure following the formation of the conductive lines 4506 and vias 4502 and 4504.

The embodiments described herein provide for the formation of mandrel lines and non-mandrel lines that are formed from dissimilar materials, and thus, may be selectively etched. The selectively of the mandrel and non-mandrel lines provides for selectively forming vias in the regions defined by the mandrel and non-mandrel lines.

The embodiments described herein provide for patterning via locations while mandrel and non-mandrel lines are defined on the substrate. Such embodiments allow for substantially self-aligning vias with a greater margin of alignment error when patterning the vias using a mask. The greater margin of error in mask alignment allows vias to be formed as the pitch scale of the devices decreases.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming conductive contacts on a semiconductor wafer, the method comprising:
    forming a hardmask on an insulator layer, a planarizing layer on the hardmask and a layer of sacrificial mandrel material on the planarizing layer;
    removing portions of the layer of sacrificial mandrel material to expose portions of the planarizing layer and form a first sacrificial mandrel and a second sacrificial mandrel on the planarizing layer;
depositing a layer of spacer material over the planarizing layer, the first sacrificial mandrel and the second sacrificial mandrel;
depositing a first filler material over the layer of spacer material;
patterning a first mask over the filler material;
removing portions of the first filler material to expose a portion of the layer of spacer material over a portion of the first sacrificial mandrel and removing the mask;
removing a portion of the layer of spacer material and an exposed portion of the first sacrificial mandrel to form a first cavity that exposes a portion of the planarizing layer;
filling the first cavity with a second filler material;
patterning a second mask over the first filler material;
removing portions of the first filler material to form a second cavity that exposes portions of the layer of spacer material between the first cavity and the second sacrificial mandrel;
filling the second cavity with the second filler material;
patterning a third mask over a portion of the second sacrificial mandrel;
selectively removing exposed portions of the second filler material, a portion of the layer of spacer material, the planarizing layer and the hardmask to form a third cavity;
patterning a fourth mask over a portion of the second sacrificial mandrel;
removing an exposed portion of the second sacrificial mandrel, a portion of the planarizing layer and a portion of the hardmask to form a fourth cavity;
removing exposed portions of the insulator layer to increase a depth of the third cavity and a depth of the fourth cavity; and
filling the third cavity and the fourth cavity with a conductive material.

2. The method of claim 1, further comprising prior to removing the exposed portions of the insulator layer to increase a depth of the first cavity and a depth of the second cavity, removing the first sacrificial mandrel and the second sacrificial mandrel.

3. The method of claim 2, further comprising removing exposed portions of the planarizing layer and the hardmask after removing the exposed portions of the insulator layer to increase a depth of the first cavity and a depth of the second cavity.

4. The method of claim 3, further comprising removing exposed portions of the insulator layer to form a fourth cavity.

5. The method of claim 4, further comprising filling the fourth cavity with the conductive material while filling the first cavity and the second cavity with the conductive material.

6. The method of claim 1, wherein the conductive material in the first cavity contacts an underlying conductive material.

7. The method of claim 1, wherein the third cavity defines a conductive via and the second cavity defines a conductive via.

8. The method of claim 1, wherein the sacrificial mandrel material, the spacer material, and the filler material are dissimilar materials.

9. The method of claim 1, wherein the spacer material includes an oxide material.

10. The method of claim 1, wherein the layer of sacrificial mandrel material includes a semiconductor material.

11. The method of claim 1, wherein the filler material includes a flowable carbide material.

12. The method of claim 1, wherein the spacer material includes silicon oxide.

13. The method of claim 1, wherein the spacer material includes a dielectric nitride.

14. The method of claim 1, wherein the spacer material includes silicon nitride.

15. The method of claim 1, wherein the spacer material includes a dielectric oxynitride.

16. The method of claim 1, wherein removing portions of the first filler material to form the second cavity includes a reactive ion etching process.

17. The method of claim 1, wherein removing exposed portions of the insulator layer to increase a reactive ion etching process.

18. The method of claim 1, wherein removing exposed portions of the insulator layer to increase a depth of the third cavity and a depth of the fourth cavity includes removing exposed portions of the insulator layer to form trenches in the insulator layer.

19. The method of claim 18, wherein filling the third cavity and the fourth cavity with a conductive material includes filling the trenches with the conductive material.

20. The method of claim 19, wherein the trenches define conductive lines.

* * * * *